(12) United States Patent
Mitsui et al.

(10) Patent No.: US 8,513,651 B2
(45) Date of Patent: Aug. 20, 2013

(54) PHOTOELECTRIC CONVERSION DEVICE, PRODUCTION METHOD THEREOF AND IMAGING DEVICE

(75) Inventors: Tetsuro Mitsui, Kanagawa (JP); Kimiatsu Nomura, Kangawa (JP); Mitsumasa Hamano, Kanagawa (JP)

(73) Assignee: Fujifilm Corporation (JP)

( * ) Notice: Subject to any disclaimer, the term of this patent is extended or adjusted under 35 U.S.C. 154(b) by 413 days.

(21) Appl. No.: 12/794,220

(22) Filed: Jun. 4, 2010

(65) Prior Publication Data

US 2010/0308372 A1 Dec. 9, 2010

(30) Foreign Application Priority Data

Jun. 5, 2009 (JP) ................................. 2009-136722
Jun. 3, 2010 (JP) ................................. 2010-127490

(51) Int. Cl.
*H01L 29/12* (2006.01)

(52) U.S. Cl.
USPC ....................... 257/40; 257/184; 257/E51.039

(58) Field of Classification Search
USPC .............................. 257/184, E51.039; 438/94
See application file for complete search history.

(56) References Cited

U.S. PATENT DOCUMENTS

| | | | |
|---|---|---|---|
| 2005/0205903 A1* | 9/2005 | Hioki | 257/291 |
| 2005/0211293 A1* | 9/2005 | Enomoto et al. | 136/263 |
| 2006/0054987 A1 | 3/2006 | Nii | |
| 2007/0298219 A1* | 12/2007 | Watanabe et al. | 428/141 |
| 2009/0050881 A1* | 2/2009 | Hayashi | 257/40 |
| 2009/0101953 A1 | 4/2009 | Hayashi et al. | |
| 2009/0223566 A1 | 9/2009 | Mitsui et al. | |

FOREIGN PATENT DOCUMENTS

| | | |
|---|---|---|
| JP | 2002-076391 A | 3/2002 |
| JP | 2002-270923 A | 9/2002 |
| JP | 2006-100766 A | 4/2006 |
| JP | 2007-123707 A | 5/2007 |
| JP | 2009-49278 A | 3/2009 |
| JP | 2009-99866 A | 5/2009 |
| JP | 2010-103457 A | 5/2010 |

OTHER PUBLICATIONS

Guobin Ma et al. "Orientation and photoluminescence of C60 crystallites in C60-polymethyl methacrylate films"; Thin Solid Films vol. 375, No. 1-2, Oct. 31, 2000; pp. 292-295.*

(Continued)

*Primary Examiner* — David Vu
*Assistant Examiner* — Sitaramarao S Yechuri
(74) *Attorney, Agent, or Firm* — Studebaker & Brackett PC

(57) ABSTRACT

Provided is a photoelectric conversion device comprising an electrically conductive film, a photoelectric conversion film, and a transparent electrically conductive film, wherein the photoelectric conversion film contains a fullerene or a fullerene derivative and a photoelectric conversion material having an absorption spectrum satisfying at least either the following condition (A) or (B):

$$\lambda_{M1} < \lambda_{L1} \text{ and } \lambda_{M2} < \lambda_{L2} \tag{A}$$

$$\lambda_{M1} < \lambda_{L1} \text{ and } \Delta|\lambda_{M1} - \lambda_{L1}| > \Delta|\lambda_{M2} - \lambda_{L2}| \tag{B}$$

wherein $\lambda_{L1}$, $\lambda_{L2}$, $\lambda_{M1}$ and $\lambda_{M2}$ are the wavelength at an absorption intensity of ½ of the maximum absorption intensity in the wavelength range of from 400 to 800 nm, each of $\lambda_{L1}$ and $\lambda_{L2}$ represents the wavelength in a chloroform solution spectrum when the photoelectric conversion material is dissolved in chloroform, and each of $\lambda_{M1}$ and $\lambda_{M2}$ represents the wavelength in a thin-film absorption spectrum of the photoelectric conversion material alone, provided that $\lambda_{L1} < \lambda_{L2}$ and $\lambda_{M1} < \lambda_{M2}$.

10 Claims, 11 Drawing Sheets

(56) References Cited

OTHER PUBLICATIONS

K Suemori et al.; "Enhanced Photovoltaic Performance in Fullerence: Phthalocyanine Codeposited Films Deposited on Heated Substrate"; Japanese Journal of Applied Physics; vol. 43, No. 8A; pp. L1014-L1016; 2004.*

The Extended European Search Report dated Feb. 22, 2011; European Application No./ Patent No. 10164931.7-1235 / 2259359.

K.Suemori et al.; "Enhanced Photovoltaic Performance in Fullerence: Phthalocyanine Codeposited Films Deposited on Heated Substrate"; Japanese Journal of Applied Physics; vol. 43, No. 8A; pp. L1014-L1016; 2004.

Japanese Office Action "Notification of Reasons for Refusal" with mailing date of May 10, 2011; Japanese Patent Application No. 2010-127490 with translation.

T. Mitsui et al.; U.S. Appl. No. 12/793,195, filed Jun. 3, 2010.

T. Mitsui; U.S. Appl. No. 12/794,248, filed Jun. 4, 2010.

I. Kaulach et al. "Magnetic Field Influence on Photovoltaic Effect of PMMA Doped With Dimethylaminobenzylidene 1, 3-Indandione and Fullerene C60 Derivative"; Latvian Journal of Physics and Technical Sciences; 2005, No. 5; pp. 3-11; ISSN 0868-8257.

Japanese Office Action "Notification of Reasons for Refusal" with mailing date of Nov. 2, 2010; Japanese Patent Application No. 2010-127490; with English translation.

Japanese Official Communication issued on Oct. 23, 2012, which corresponds to Japanese Patent Application No. 2010-294330 and is related to U.S. Appl. No. 12/794,220 with partial translation.

The Decision to refuse a European Patent application issued on Jun. 11, 2013, which corresponds to European Patent Application No. 10 164 931.7-1555 and is related to U.S. Appl. No. 12/794,220.

\* cited by examiner

PHOTOELECTRIC CONVERSION DEVICE, PRODUCTION METHOD THEREOF AND IMAGING DEVICE

BACKGROUND OF THE INVENTION

1. Field of the Invention

The present invention relates to a photoelectric conversion device, a production method thereof and an imaging device.

2. Description of the Related Art

As for the solid-state imaging device, there is widely used a flat light-receiving device where photoelectric conversion sites are two-dimensionally arrayed in a semiconductor to form pixels and a signal generated by photoelectric conversion in each pixel is charge-transferred and read out according to a CCD or CMOS format. The conventional photoelectric conversion site is generally formed, for example, by forming PN junction in a semiconductor such as Si.

In recent years, with the progress of a multi-pixel system, the pixel size and in turn, the area of a photodiode part becomes small, and this brings about problems of reduction in the aperture ratio and reduction in the light gathering efficiency. As for the measure to enhance the aperture ratio and the like, studies are being made on a solid-state imaging device having a photoelectric conversion layer (a photoelectric conversion film) using an organic material.

In an organic photoelectric conversion device, it is one of key issues to obtain a high S/N ratio. In order to raise the S/N ratio of an organic photoelectric conversion device, enhancement of photoelectric conversion efficiency and reduction of dark current are required. As to the technique for enhancing the photoelectric conversion efficiency, introduction of a pn junction or a bulk heterostructure in a photoelectric conversion film is studied, and as to the technique for reducing the dark current, introduction or the like of a blocking layer is studied.

In the case of introducing a pn junction or a bulk heterostructure, an increase of dark current often arises as a problem. Also, the improvement of photoelectric conversion efficiency differs in degree according to the combination of materials and in particular, when a method of introducing a bulk heterostructure is employed, the S/N is sometimes not increased from that before introduction of the bulk heterostructure. Thus, it is important what materials are combined.

The kind of material used or the film structure of a photoelectric conversion layer is not only one of main causes for the photoelectric conversion efficiency (exciton dissociation efficiency, charge transportability) and dark current (e.g., dark carrier amount) but also becomes a governing factor of the signal response speed, though this is little referred to in past reports. Particularly, in the case of using an organic photoelectric conversion device as a solid-state imaging device, the matter of importance is to satisfy all of high photoelectric conversion efficiency, low dark current and high response speed, but an organic photoelectric conversion material or a device structure satisfying these performances has not been specifically described so far.

A technique of introducing a bulk heterostructure using a fullerene or a fullerene derivative into the organic photoelectric conversion film so as to bring out high photoelectric conversion efficiency (high exciton dissociation efficiency) is known.

For example, Patent Document 1 discloses a photoelectric conversion layer containing a fullerene or a fullerene derivative. However, further improvement is required in progress of photoelectric conversion efficiency and response speed, and in lowering of dark current.

Also, Patent Document 2 describes a solar cell using a bulk heterofilm composed of a plurality of organic semiconductors, where at least one organic semiconductor is a crystal grain, but this publication has no disclosure about high-speed responsivity or reduction of dark current and is silent on the application to an imaging device using a photoelectric conversion device.

Furthermore, in Non-Patent Document 1, it is suggested that the film structure of a photoelectric conversion layer is important for the elevation of efficiency. However, the photoelectric conversion device of Non-Patent Document 1 is also designed with a solar cell in mind and when the technique described in this publication is directly applied to an imaging sensor, the dark current attributable to the material used or film structure is large, making it impossible to use the device as an imaging device.

[Patent Document 1] JP-A-2007-123707 (the term "JP-A" as used herein means an "unexamined published Japanese patent application")

[Patent Document 2] JP-A-2002-076391

[Non-Patent Document 1] Jpn. J. Appl. Phys., 43, L1014 (2004)

SUMMARY OF THE INVENTION

An object of the present invention is to provide a photoelectric conversion device and a solid-state imaging device, which are excellent in photoelectric conversion efficiency and high-speed responsivity.

As a result of intensive studies, the present inventors have found that it is important for obtaining high photoelectric conversion efficiency to create a junction state by combining materials incapable of forming an exciton quenching site at the interface between a photoelectric conversion material and fullerenes and increase the exciton diffusion length in a photoelectric conversion material, thereby enabling more efficient exciton dissociation between the photoelectric conversion material and fullerenes, and it is also important for obtaining high-speed responsivity to construct a film structure where a carrier path for the transport of an electron in the fullerenes and a carrier path for the transport of a hole in the photoelectric conversion material are separately running on in the transport direction.

That is, the above-described object can be attained by the following measures.

(1) A photoelectric conversion device comprising an electrically conductive film (an electrically conductive layer), a photoelectric conversion layer, and a transparent electrically conductive film (a transparent electrically conductive layer), wherein said photoelectric conversion layer contains a fullerene or a fullerene derivative and a photoelectric conversion material having an absorption spectrum satisfying at least either the following condition (A) or (B):

$$\lambda_{M1} < \lambda_{L1} \text{ and } \lambda_{M2} < \lambda_{L2} \quad (A)$$

$$\lambda_{M1} < \lambda_{L1} \text{ and } \Delta|\lambda_{M1} - \lambda_{L1}| > \Delta|\lambda_{M2} - \lambda_{L2}| \quad (B)$$

wherein $\lambda_{L1}$, $\lambda_{L2}$, $\lambda_{M1}$ and $\lambda_{M2}$ are the wavelength at an absorption intensity of ½ of the maximum absorption intensity in the wavelength range of from 400 to 800 nm, each of $\lambda_{L1}$ and $\lambda_{L2}$ represents the wavelength in a chloroform solution spectrum when said photoelectric conversion material is dissolved in chloroform, and each of $\lambda_{M1}$ and $\lambda_{M2}$ represents the wavelength in a thin-film absorption spectrum of said photoelectric conversion material alone, provided that $\lambda_{L1} < \lambda_{L2}$ and $\lambda_{M1} < \lambda_{M2}$.

(2) The photoelectric conversion device as described in (1) above, wherein said condition (B) is the following condition (B'):

$$\lambda_{M1} < \lambda_{L1} \text{ and } \Delta|\lambda_{M1}-\lambda_{L1}| > 2 \times \Delta|\lambda_{M2}-\lambda_{L2}| \quad (B')$$

(3) The photoelectric conversion device as described in (1) above, wherein said condition (B) is the following condition (B"):

$$\lambda_{M1} < \lambda_{L1} \text{ and } \Delta|\lambda_{M1}-\lambda_{L1}| > 3 \times \Delta|\lambda_{M2}-\lambda_{L2}| \quad (B'')$$

(4) The photoelectric conversion device as described in any one of (1) to (3) above, which contains a state where at least a part of said fullerene or fullerene derivative is crystallized.

(5) The photoelectric conversion device as described in (4) above, wherein said fullerene or fullerene derivative is oriented in the (111) direction with respect to the substrate.

(6) The photoelectric conversion device as described in any one of (1) to (5) above, wherein said electrically conductive film, said photoelectric conversion layer and said transparent electrically conductive film are stacked in this order.

(7) An imaging device equipped with the photoelectric conversion device described in any one of (1) to (6) above, comprising:
a semiconductor substrate having stacked thereabove said photoelectric conversion layer,
a charge accumulation part for accumulating electric charges generated in said photoelectric conversion layer, which is formed inside of said semiconductor substrate, and
a connection part for transmitting an electric charge of said photoelectric conversion layer to said charge accumulation part.

(8) A production method of the photoelectric conversion device described in any one of (1) to (6) above, comprising:
a step of forming said electrically conductive film, said photoelectric conversion layer and said transparent electrically conductive film on a substrate, and
a step of, in the formation of said photoelectric conversion layer, co-depositing a fullerene or a fullerene derivative and a photoelectric conversion material having an absorption spectrum satisfying at least either the condition (A) or (B), in a state of heating the substrate.

(9) The production method as described in (8) above, wherein the vapor deposition rate at said co-deposition is from 0.5 to 3 Å/s.

(10) The production method as described in (8) or (9) above, wherein the temperature of said substrate is 100° C. or less.

According to the present invention, a photoelectric conversion device and a solid-state imaging device, which are excellent in photoelectric conversion efficiency and high-speed responsivity, can be provided.

In the formulae above, 11 denotes Lower electrode (electrically conductive film), 12 denotes Photoelectric conversion layer (photoelectric conversion film), 15 denotes Upper electrode (transparent electrically conductive film), 16A denotes Electron blocking layer, 16B denotes Hole blocking layer, 100, 200 and 300 denote Imaging device.

DETAILED DESCRIPTION OF THE INVENTION

[Photoelectric Conversion Device]

The photoelectric conversion device of the present invention is a photoelectric conversion device comprising an electrically conductive film (an electrically conductive layer), a photoelectric conversion layer (a photoelectric conversion film), and a transparent electrically conductive film (a transparent electrically conductive layer), and respective films are preferably stacked in the order above.

A preferred embodiment of the photoelectric conversion device of the present invention is described below.

Figure 1:
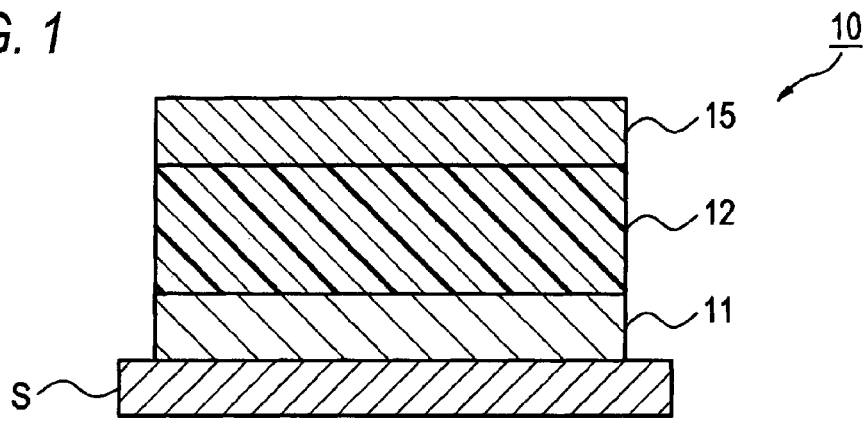
FIG. 1 is a schematic cross-sectional view showing one configuration example of the photoelectric conversion device.

FIG. 1 shows a configuration example of the photoelectric conversion device according to this embodiment. The photoelectric conversion device 10 shown in FIG. 1 has a configuration such that a substrate S, an electrically conductive film (hereinafter referred to as a "lower electrode") 11 functioning as a lower electrode formed on the substrate S, a photoelectric conversion layer 12 formed on the lower electrode 11, and a transparent electrically conductive film (hereinafter referred to as an "upper electrode") 15 functioning as an upper electrode are stacked in this order.

Figure 2A:
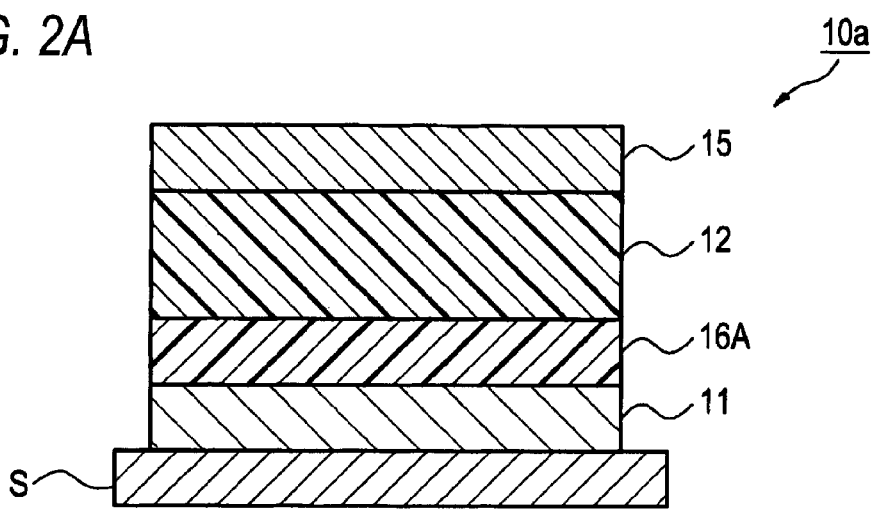
FIGS. 2A and 2B are schematic cross-sectional views showing another configuration example of the photoelectric conversion device.
Figure 2B:
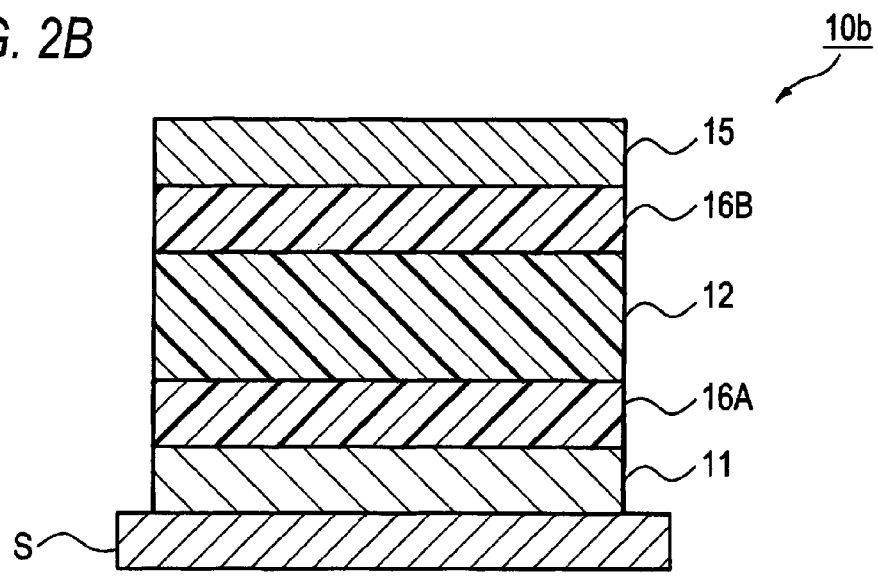

FIGS. 2A and 2B show another configuration example of the photoelectric conversion device. The photoelectric conversion device shown in FIGS. 2A and 2B has a configuration including a charge blocking layer (electron blocking layer, hole blocking layer). The photoelectric conversion device 10a shown in FIG. 2A is configured to include an electron blocking layer 16A between the lower electrode 11 and the photoelectric conversion layer 12, and the photoelectric conversion device 10b shown in FIG. 2B is configured to further include a hole blocking layer 16B between the upper electrode 15 and the photoelectric conversion layer 12.

By providing an electron blocking layer 16A and a hole blocking layer 16B as shown in FIGS. 2A and 2B, injection of an electron or a hole into the photoelectric conversion layer 12 from the electrode upon application of a voltage can be suppressed, and the dark current can be more unfailingly reduced.

Incidentally, the configuration shown in FIGS. 2A and 2B is a configuration designed to apply a voltage so that an electron can move to the upper electrode 15 and a hole can move to the lower electrode 11 (that is, the upper electrode 15 can serve as the electrode for collecting electrons), but in the case of applying a voltage to move an electrode to the lower electrode 11 and move a hole to the upper electrode 15 (that is, the electrode for collecting electrons is assigned to the lower electrode 11), the hole blocking layer is formed between the lower electrode 11 and the photoelectric conversion layer 12, and the electron blocking layer is formed between the upper electrode 15 and the photoelectric conversion layer 12.

Also, a plurality of layers may be formed for the charge blocking layer.

The elements constituting the photoelectric conversion device according to this embodiment are described below.

(Electrode)

Each of the electrodes (upper electrode (transparent electrically conductive film) 15 and lower electrode (electrically conductive film) 11) is composed of an electrically conductive material. Examples of the electrically conductive material which can be used include a metal, an alloy, a metal oxide, an electroconductive compound, and a mixture thereof.

Light is incident from the upper electrode 15 and therefore, the upper electrode 15 needs to be sufficiently transparent to light that is to be detected. Specific examples thereof include an electrically conductive metal oxide such as tin oxide doped with antimony or fluorine (ATO, FTO), tin oxide, zinc oxide, indium oxide, indium tin oxide (ITO) and indium zinc oxide (IZO); a metal thin film such as gold, silver, chromium and nickel; a mixture or laminate of such a metal and such an electrically conductive metal oxide; an inorganic electrically conductive substance such as copper iodide and copper sulfide; an organic electrically conductive material such as polyaniline, polythiophene and polypyrrole; and a laminate of such a material and ITO. Among these, an electrically conductive metal oxide is preferred in view of high electrical conductivity, transparency and the like. The upper electrode 15 is deposited on the photoelectric conversion layer 12 and therefore, is preferably deposited by a method causing no deterioration of the properties of the photoelectric conversion layer 12.

The lower electrode 11 includes, according to usage, a case where transparency is imparted, a case where, conversely, a material capable of reflecting light is used without imparting transparency, and the like. Specific examples thereof include an electrically conductive metal oxide such as tin oxide doped with antimony or fluorine (ATO, FTO), tin oxide, zinc oxide, indium oxide, indium tin oxide (ITO) and indium zinc oxide (IZO); a metal such as gold, silver, chromium, nickel, titanium, tungsten and aluminum; an electrically conductive compound such as oxide and nitride of the metal such as titanium nitride; a mixture or laminate of such a metal and such an electrically conductive metal oxide; an inorganic electrically conductive substance such as copper iodide and copper sulfide; an organic electrically conductive material such as polyaniline, polythiophene and polypyrrole; and a laminate of such a material and ITO.

The method for forming the electrode is not particularly limited and may be appropriately selected by taking into consideration the aptitude for the electrode material. Specifically, the electrode can be formed, for example, by a wet system such as printing and coating, a physical system such as vacuum deposition. sputtering and ion plating, or a chemical system such as CVD and plasma CVD.

In the case where the material of the electrode is ITO, the electrode can be formed by a method such as electron beam method, sputtering method, resistance heating deposition method, chemical reaction method (e.g., sol-gel method) and coating of a dispersion of indium tin oxide. The film produced using ITO may be further subjected to, for example, a UV-ozone treatment or a plasma treatment.

The upper electrode 15 is preferably produced in a plasma-free state. When the upper electrode 15 is produced in a plasma-free state, the effect of plasma on the substrate can be reduced and good photoelectric conversion properties can be obtained. Here, the plasma-free state means a state where plasma is not generated during deposition of the upper electrode 15, or a state where the distance from a plasma source to the substrate is 2 cm or more, preferably 10 cm or more, more preferably 20 cm or more, and the amount of plasma reaching the substrate is reduced.

Examples of the apparatus generating no plasma during deposition of the upper electrode 15 include an electron beam deposition apparatus (EB deposition apparatus) and a pulsed laser deposition apparatus. As for the EB deposition apparatus or pulsed laser deposition apparatus, apparatuses described, for example, in Yutaka Sawada (supervisor), Tomei Doden Maku no Shin Tenkai (New Development of Transparent Conductive Film), CMC (1999), Yutaka Sawada (supervisor), Tomei Doden Maku no Shin Tenkai II (New Development of Transparent Conductive Film II), CMC (2002), Tomei Doden Maku no Gijutsu (Technology of Transparent Conductive Film), JSPS, Ohmsha (1999), and references cited therein may be used. In the following, the method of depositing the transparent electrode film by using an EB deposition apparatus is referred to as an EB deposition method, and the method of depositing the transparent electrode film by using a pulsed laser deposition apparatus is referred to as a pulsed laser deposition method.

As for the apparatus capable of realizing a state where the distance from a plasma source to the substrate is 2 cm or more and the amount of plasma reaching the substrate is reduced (hereinafter referred to as a "plasma-free film depositing apparatus"), an opposed-target sputtering apparatus, an arc plasma deposition method and the like are considered, and examples of such an apparatuses which can be used include those described in Yutaka Sawada (supervisor), Tomei Doden Maku no Shin Tenkai (New Development of Transparent Conductive Film), CMC (1999), Yutaka Sawada (supervisor), Tomei Doden Makuno Shin Tenkai II (New Development of Transparent Conductive Film II), CMC (2002), Tomei Doden Maku no Gijutsu (Technology of Transparent Conductive Film), JSPS, Ohmsha (1999), and references cited therein.

In the case where the upper electrode 15 is a transparent electrically conductive film such as transparent electrically conductive metal oxide (TCO), a DC short or an increase of leak current sometimes occurs. One of causes thereof is considered because fine cracks introduced into the photoelectric conversion layer 12 are coveraged by a dense film such as TCO to increase the conduction with the first electrode film 11 on the opposite side. Therefore, in the case of an electrode having relatively poor film quality such as Al, the leak current hardly increases. The increase of leak current can be greatly suppressed by controlling the film thickness of the upper electrode 15 with respect to the film thickness (that is, the crack depth) of the photoelectric conversion layer 12. The thickness of the upper electrode 15 is preferably ⅕ or less, more preferably 1/10 or less, of the thickness of the photoelectric conversion layer 12.

Usually, when the thickness of the electrically conductive film is made smaller than a certain range, an abrupt increase of the resistance value is incurred, but in the solid-state imaging device where the photoelectric conversion device according to this embodiment is incorporated, the sheet resistance may be, preferably, from 100 to 10,000 Ω/sq. and the latitude as to in which range the film thickness can be reduced is large. Also, as the thickness of the upper electrode (transparent electrically conductive film) 15 is smaller, the quantity of light absorbed is reduced and the light transmittance is generally increased. The increase of light transmittance brings about an increase of light absorption in the photoelectric conversion layer 12 and an increase of photoelectric conversion performance, and this is very preferred. Considering the suppression of leak current and the increase of resistance value of thin film as well as the increase of transmittance, which are associated with reduction in the film thickness, the thickness of the upper electrode 15 is preferably from 5 to 100 nm, more preferably from 5 to 20 nm.

(Photoelectric Conversion Layer)

The photoelectric conversion layer is formed of a fullerene or a fullerene derivative and a photoelectric conversion material having an absorption spectrum satisfying at least either the following condition (A) or (B):

$$\lambda_{M1} < \lambda_{L1} \text{ and } \lambda_{M2} < \lambda_{L2} \tag{A}$$

$$\lambda_{M1} < \lambda_{L1} \text{ and } \Delta|\lambda_{M1} - \lambda_{L1}| > \Delta|\lambda_{M2} - \lambda_{L2}| \tag{B}$$

wherein $\lambda_{L1}$, $\lambda_{L2}$, $\lambda_{M1}$ and $\lambda_{M2}$ are the wavelength at an absorption intensity of ½ of the maximum absorption intensity in the wavelength range of from 400 to 800 nm, each of $\lambda_{L1}$ and $\lambda_{L2}$ represents the wavelength in a chloroform solution spectrum when the photoelectric conversion material is dissolved in chloroform, and each of $\lambda_{M1}$ and $\lambda_{M1}$ represents the wavelength in a thin-film absorption spectrum of the photoelectric conversion material alone, provided that $\lambda_{L1} < \lambda_{L2}$ and $\lambda_{M1} < \lambda_{M2}$. That is, $\lambda_{L1}$ and $\lambda_{M1}$ indicate the wavelength on the short wavelength side, and $\lambda_{L2}$ and $\lambda_{M2}$ indicate the wavelength on the long wavelength side.

In other words, the thin-film absorption spectrum of the photoelectric conversion material satisfying at least either the condition (A) or (B) is shifted to the short wavelength side with respect to the solution absorption spectrum in chloroform. In general, as for the absorption spectrum in chloroform solvent, the absorption spectrum is shifted to the long wavelength side due to the solvent effect, and the molecule of the photoelectric conversion material itself is considered to have absorption at a shorter wavelength. The photoelectric conversion material specified in the method of the present invention is considered, when it is in a thin film state, to have a higher proportion of H-aggregation than the proportion of J-aggregation or restrict the interaction in the J-aggregation direction to a small variety of or weak interactions (the molecules are present in a smaller variety of molecular junctions). The general vapor deposition film has a high H-aggregation propensity or a high J-aggregation propensity or allows H-aggregation and J-aggregation to be mixed at the same level, but according to the studies by the present inventors, it has been found that when a photoelectric conversion material capable of realizing a film structure having a higher proportion of H-aggregation (or a smaller proportion of J-aggregation and a uniform aggregation state) is used, a remarkably high response speed can be obtained.

The state elevated in the proportion of H-aggregation produces a structure where hole and electron transport portions (donor part and acceptor part) run side by side in one direction. If hole and electron transport portions are randomly or alternately present with respect to the charge transport direction, transport inhibition may be caused at the transportation of each electric charge, because the electric charge must be transported across a structure not participating in the transport. In this respect, when the proportion of H-aggregation is high, it is expected that the electric charge is not transported across such a structure uninvolved in the transport and therefore, constraint response is readily obtained. Also, since the transport in the moment direction of J-aggregation is exactly the transport in the direction where respective charge transport parts are alternately present, the state having a smaller variety of or weaker interactions in the J-aggregation direction is considered to make larger the length for which respective charge transport portions run side by side, and in turn enable high-speed response.

The condition (B) is preferably the following condition (B'), more preferably the following condition (B"):

$$\lambda_{M1} < \lambda_{L1} \text{ and } \Delta|\lambda_{M1} - \lambda_{L1}| > 2 \times \Delta|\lambda_{M2} - \lambda_{L2}| \tag{B'}$$

$$\lambda_{M1} < \lambda_{L1} \text{ and } \Delta|\lambda_{M1} - \lambda_{L1}| > 3 \times \Delta|\lambda_{M2} - \lambda_{L2}| \tag{B''}$$

The photoelectric conversion material satisfying at least either the condition (A) or (B) is preferably an organic material, more preferably a triarylamine compound, and the triarylamine compound is preferably a compound represented by the following formula (I).

Formula (I):

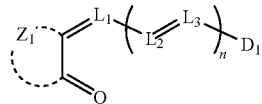

In formula (I), $Z_1$ represents an atomic group necessary for forming a 5- or 6-membered ring, each of $L_1$, $L_2$ and $L_3$ represents an unsubstituted methine group or a substituted methine group, $D_1$ represents an atomic group, and n represents an integer of 0 or more.

$Z_1$ represents an atomic group necessary for forming a 5- or 6-membered ring. The ring formed is preferably a ring usually used as an acidic nucleus in merocyanine dyes, and specific examples thereof include the followings:

(a) 1,3-dicarbonyl nucleus: such as 1,3-indanedione nucleus, 1,3-cyclohexanedione, 5,5-dimethyl-1,3-cyclohexanedione and 1,3-dioxane-4,6-dione, (b) pyrazolinone nucleus: such as 1-phenyl-2-pyrazolin-5-one, 3-methyl-1-phenyl-2-pyrazolin-5-one and 1-(2-benzothiazoyl)-3-methyl-2-pyrazolin-5-one, (c) isoxazolinone nucleus: such as 3-phenyl-2-isoxazolin-5-one and 3-methyl-2-isoxazolin-5-one, (d) oxyindole nucleus: such as 1-alkyl-2,3-dihydro-2-oxyindole, (e) 2,4,6-triketohexahydropyrimidine nucleus: such as barbituric acid, 2-thiobarbituric acid and their derivatives, examples of the derivative include a 1-alkyl form such as 1-methyl and 1-ethyl, a 1,3-dialkyl form such as 1,3-dimethyl, 1,3-diethyl and 1,3-dibutyl, a 1,3-diaryl form such as 1,3-diphenyl, 1,3-di(p-chlorophenyl) and 1,3-di(p-ethoxycarbonylphenyl), a 1-alkyl-1-aryl form such as 1-ethyl-3-phenyl, and a 1,3-diheterocycle-substituted form such as 1,3-di(2-pyridyl), (f) 2-thio-2,4-thiazolidinedione nucleus: such as rhodanine and its derivatives, examples of the derivative include a 3-alkylrhodanine such as 3-methylrhodanine, 3-ethylrhodanine and 3-allylrhodanine, a 3-arylrhodanine such as 3-phenylrhodanine, and a 3-heterocycle-substituted rhodanine such as 3-(2-pyridyl)rhodanine, (g) 2-thio-2,4-oxazolidinedione (2-thio-2,4-(3H,5H)-oxazoledione) nucleus: such as 3-ethyl-2-thio-2,4-oxazolidinedione, (h) thianaphthenone nucleus: such as 3(2H)-thianaphthenone-1,1-dioxide, (i) 2-thio-2,5-thiazolidinedione nucleus: such as 3-ethyl-2-thio-2,5-thiazolidinedione, (j) 2,4-thiazolidinedione nucleus: such as 2,4-thiazolidinedione, 3-ethyl-2,4-thiazolidinedione and 3-phenyl-2,4-thiazolidinedione, (k) thiazolin-4-one nucleus: such as 4-thiazolinone and 2-ethyl-4-thiazolinone, (l) 2,4-imidazolidinedione (hydantoin) nucleus: such as 2,4-imidazolidinedione and 3-ethyl-2,4-imidazolidinedione, (m) 2-thio-2,4-imidazolidinedione (2-thiohydantoin) nucleus: such as 2-thio-2,4-imidazolidinedione and 3-ethyl-2-thio-2,4-imidazolidinedione, (n) 2-imidazolin-5-one nucleus: such as 2-propylmercapto-2-imidazolin-5-one, (O) 3,5-pyrazolidinedione nucleus: such as 1,2-diphenyl-3,5-pyrazolidinedione and 1,2-dimethyl-3,5-pyrazolidinedione, (p) benzothiophen-3-one nucleus: such as benzothiophen-3-one, oxobenzothiophen-3-one and dioxobenzothiophen-3-one, and (q) indanone nucleus: such as 1-indanone, 3-phenyl-1-indanone, 3-methyl-1-indanone, 3,3-diphenyl-1-indanone and 3,3-dimethyl-1-indanone.

The ring formed by $Z_1$ is preferably a 1,3-dicarbonyl nucleus, a pyrazolinone nucleus, a 2,4,6-triketohexahydropyrimidine nucleus (including a thioketone form, e.g., barbituric acid nucleus, 2-thiobarbituric acid nucleus), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus or an indanone nucleus, more preferably a 1,3-dicarbonyl nucleus, a 2,4,6-triketohexahydropyrimidine nucleus (including a thioketone form, e.g., barbituric acid nucleus, 2-thiobarbituric acid nucleus), a 3,5-pyrazolidinedione nucleus, a benzothiophen-3-one nucleus or an indanone nucleus, still more preferably a 1,3-dicarbonyl nucleus or a 2,4,6-triketohexahydropyrimidine nucleus (including a thioketone form, e.g., barbituric acid nucleus, 2-thiobarbituric acid nucleus), yet still more preferably a 1,3-indanedione nucleus, a barbituric acid nucleus, a 2-thiobarbituric acid nucleus, most preferably a 1,3-indanedione nucleus or a derivative thereof.

The ring formed by $Z_1$ is preferably a ring represented by the following formula:

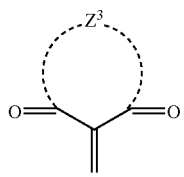

$Z^3$ represents an atomic group necessary for forming a 5- or 6-membered ring. $Z^3$ can be selected from the above-described rings formed by $Z_1$ and is preferably a 1,3-dicarbonyl nucleus or a 2,4,6-triketohexahydropyrimidine nucleus (including a thioketone form), more preferably a 1,3-indanedione nucleus, a barbituric acid nucleus, a 2-thiobarbituric acid nucleus or a derivative thereof.

It has been found that by controlling the interaction between acceptor parts, high hole transportability can be brought out in the co-deposited film with a fullerene such as $C_{60}$ or a fullerene derivative. The interaction can be controlled by the structure of acceptor part and the introduction of substituent working out to a steric hindrance. In the barbituric acid nucleus and 2-thiobarbituric acid nucleus, both two hydrogens at two N-positions are preferably substituted for by a substituent, whereby the intermolecular interaction can be controlled. Examples of the substituent include the later-described substituent W, and the substituent is preferably an alkyl group, more preferably a methyl group, an ethyl group, a propyl group or a butyl group.

In the case where the ring formed by $Z_1$ is a 1,3-indanedione nucleus, a group represented by formula (IV) or a group represented by formula (V) is preferred.

Formula (IV):

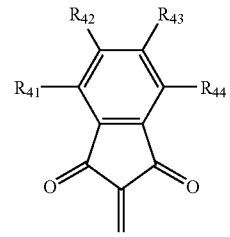

In formula (IV), each of $R_{41}$ to $R_{44}$ independently represents a hydrogen atom or a substituent.

Formula (V):

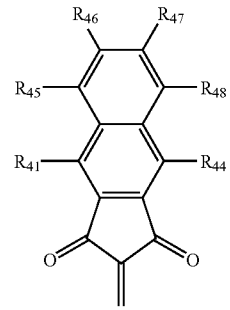

In formula (V), each of $R_{41}$, $R_{44}$ and $R_{45}$ to $R_{48}$ independently represents a hydrogen atom or a substituent.

In the case of a group represented by formula (IV), each of $R_{41}$ to $R_{44}$ independently represents a hydrogen atom or a substituent. As to the substituent, for example, those described as the after-mentioned substituent W may be applied. Adjacent members out of $R_{41}$ to $R_{44}$ may combine to form a ring, and it is preferred that $R_{42}$ and $R_{43}$ combine together to form a ring (for example, a benzene ring, a pyridine ring or a pyrazine ring). Preferably, all of $R_{41}$ to $R_{44}$ are a hydrogen atom.

The group represented by formula (IV) is preferably a group represented by formula (V).

In the case of a group represented by formula (V), each of $R_{41}$, $R_{44}$ and $R_{45}$ to $R_{48}$ independently represents a hydrogen atom or a substituent. As to the substituent, for example, those described as the after-mentioned substituent W may be applied. It is preferred that all of $R_{41}$, $R_{44}$ and $R_{45}$ to $R_{48}$ are a hydrogen atom.

In the case where the ring formed by $Z_1$ is a 2,4,6-triketohexahydropyrimidine nucleus (including a thioketone form), a group represented by formula (VI) is preferred.

Formula (VI):

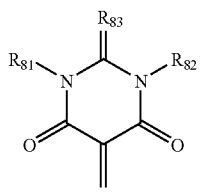

In formula (VI), each of $R_{81}$ and $R_{82}$ independently represents a hydrogen atom or a substituent, and $R_{83}$ represents an oxygen atom, a sulfur atom or a substituent.

In the case of a group represented by formula (VI), each of $R_{81}$ and $R_{82}$ independently represents a hydrogen atom or a substituent. As to the substituent, for example, those described as the after-mentioned substituent W may be applied. Each of $R_{81}$ and $R_{82}$ is independently, preferably an alkyl group, an aryl group or a heterocyclic group (e.g., 2-pyridyl), more preferably an alkyl group having a carbon number of 1 to 6 (e.g., methyl, ethyl, n-propyl, tert-butyl).

$R_{83}$ represents an oxygen atom, a sulfur atom or a substituent, but $R_{83}$ preferably represents an oxygen atom or a sulfur atom. The substituent is preferably a substituent with the bonding part being a nitrogen atom or a carbon atom. In the case of a nitrogen atom, the substituent is preferably an alkyl group (having a carbon number of 1 to 12) or an aryl group (having a carbon number of 6 to 12), and specific examples thereof include a methylamino group, an ethylamino group, a butylamino group, a hexylamino group, a phenylamino group and a naphthylamino group. In the case of a carbon atom, it may be sufficient if at least one electron-withdrawing group is further substituted. The electron-withdrawing group includes a carbonyl group, a cyano group, a sulfoxide group, a sulfonyl group and a phosphoryl group. The electron-withdrawing group preferably further has a substituent, and examples of the substituent include the after-mentioned substituent W. The substituent as $R_{83}$ is preferably what forms a 5- or 6-membered ring containing the carbon atom, and specific examples thereof include those having the following structures.

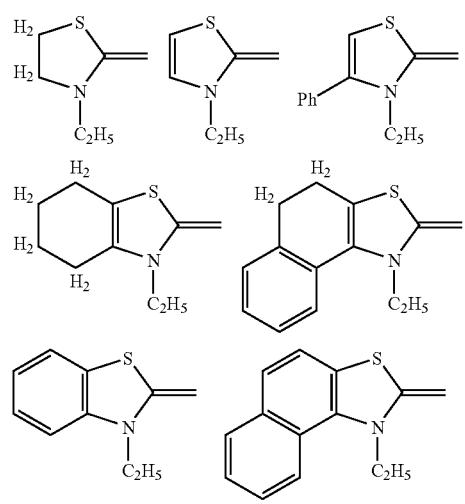

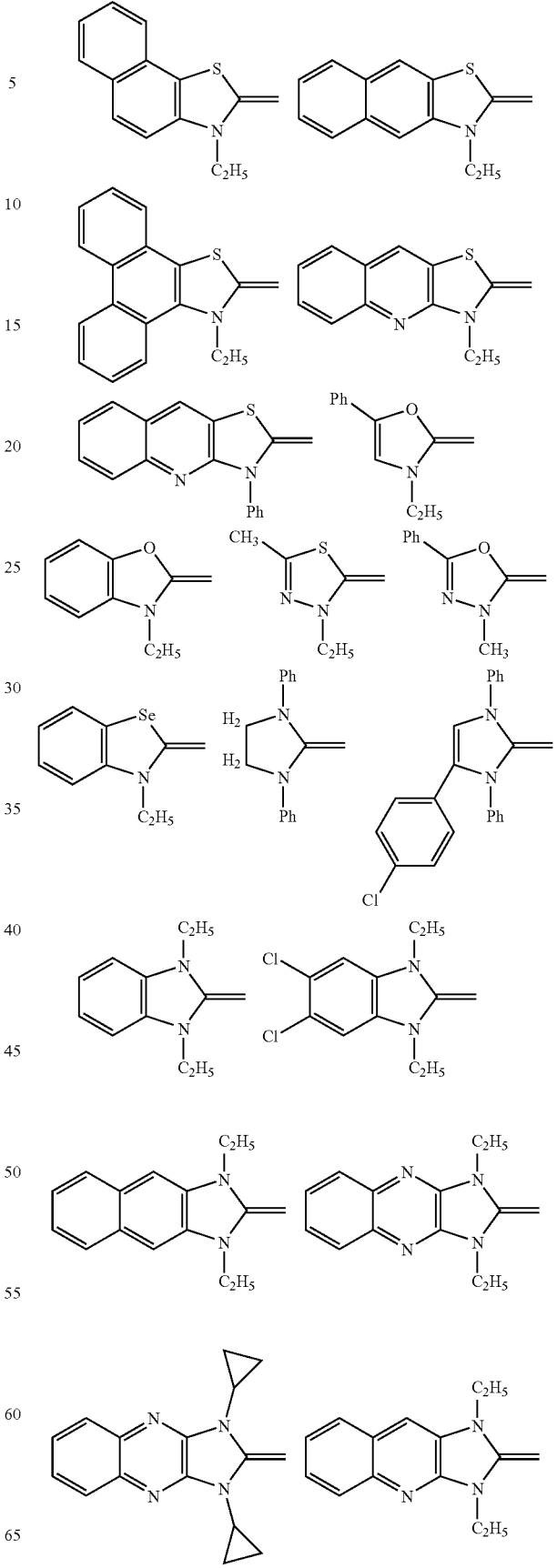

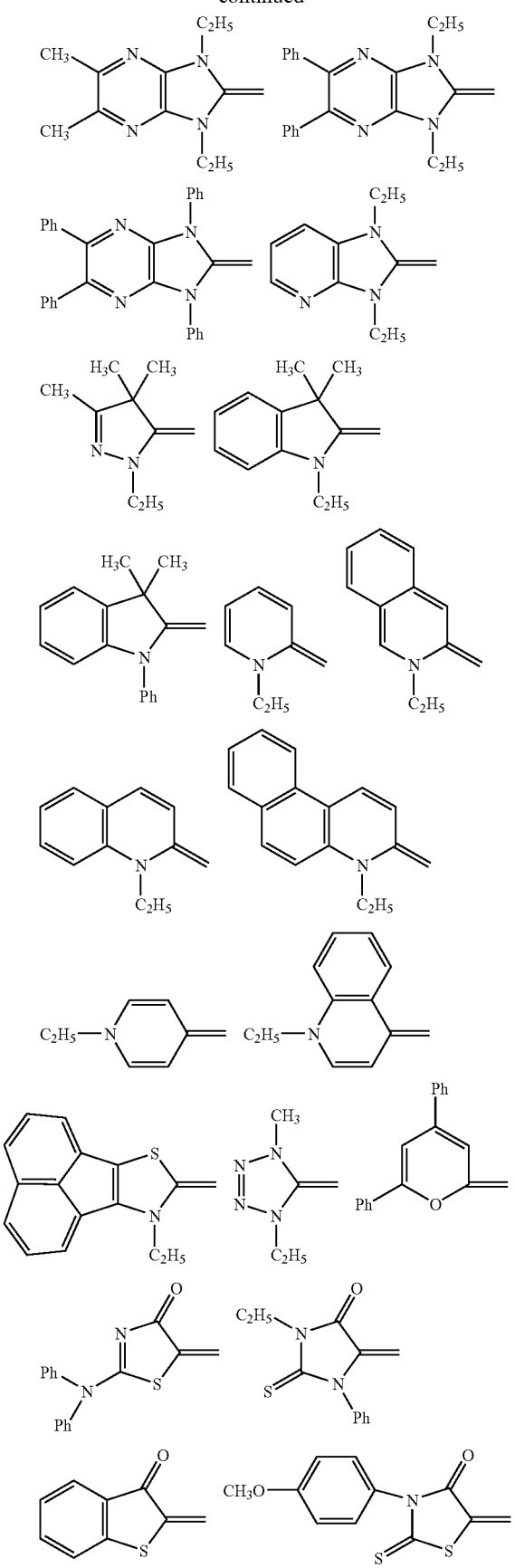
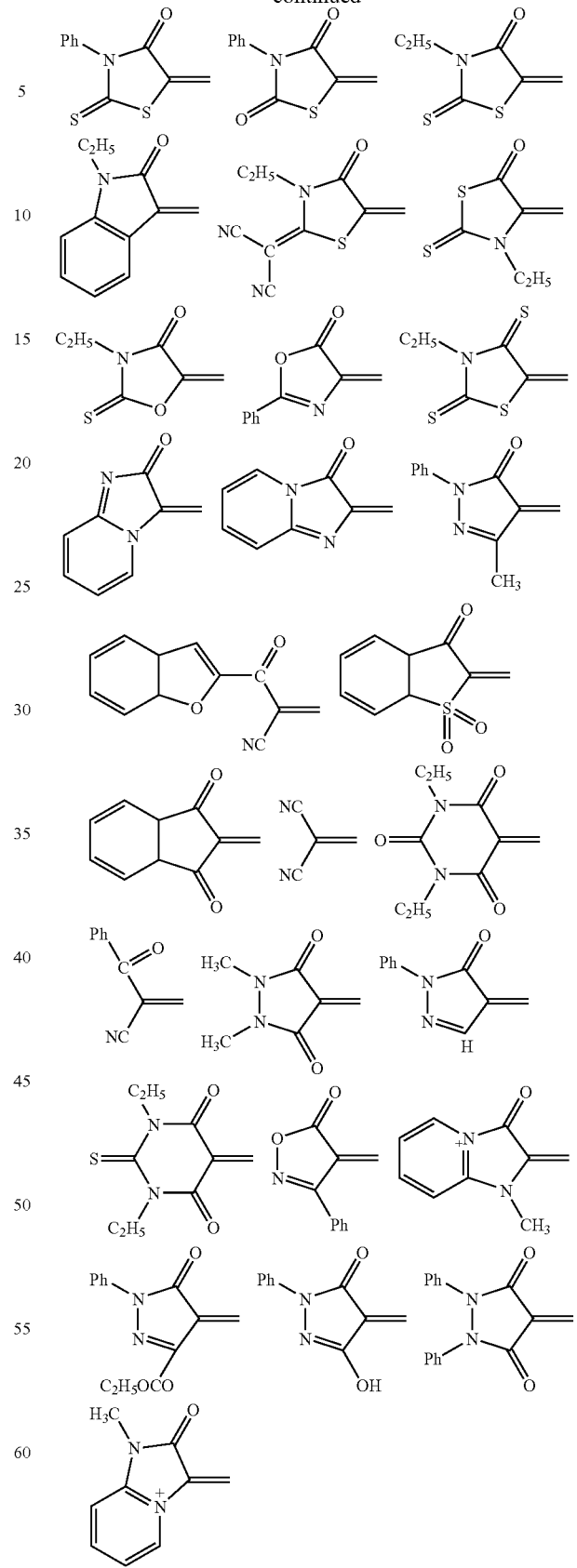
In the groups above, Ph indicates a phenyl group.

In formula (I), each of $L_1$, $L_2$ and $L_3$ independently represents an unsubstituted methine group or a substituted methine group. Substituted methine groups may combine together to form a ring (for example, a 6-membered ring such as benzene ring). Examples of the substituent of the substituted methine group include the substituent W. It is preferred that all of $L_1$, $L_2$ and $L_3$ are an unsubstituted methine group.

n represents an integer of 0 or more and is preferably an integer of 0 to 3, more preferably 0. When n is increased, the absorption wavelength region is allowed to reside on a long wavelength side, but the thermal decomposition temperature becomes low. From the standpoint of having appropriate absorption in the visible region and suppressing thermal decomposition at the vapor deposition of film, n is preferably 0.

In formula (I), $D_1$ represents an atomic group. $D_1$ is preferably a group containing $-NR^a(R^b)$, and it is more preferred that $D_1$ represents a $—NR^a(R^b)$-substituted aryl group (preferably a phenyl, naphthyl or anthracenyl group which may be substituted, more preferably a phenyl or naphthyl group which may be substituted). Each of $R^a$ and $R^b$ independently represents a hydrogen atom or a substituent. Examples of the substituent represented by $R^a$ and $R^b$ include the after-mentioned substituent W, and an aliphatic hydrocarbon group (preferably an alkyl or alkenyl group which may be substituted), an aryl group (preferably a phenyl group which may be substituted) and a heterocyclic group are preferred.

The heterocyclic group is preferably a 5-membered ring such as furan, thiophene, pyrrole and oxadiazole.

In the case where each of $R^a$ and $R^b$ is a substituent (preferably an alkyl group or an alkenyl group), the substituent may combine with a hydrogen atom or a substituent in the aromatic ring (preferably benzene ring) structure of the $—NR^a(R^b)—$ substituted aryl group to form a ring (preferably a 6-membered ring). In this case, $D_1$ is preferably a group represented by formula (VIII), (IX) or (X) described later.

The substituents $R^a$ and $R^b$ may combine together to form a ring (preferably a 5- or 6-membered ring, more preferably a 6-membered ring), or each of $R^a$ and $R^b$ may combine with a substituent in L (which indicates any one of $L_1$, $L_2$ and $L_3$) to form a ring (preferably a 5- or 6-membered ring, more preferably a 6-membered ring).

$D_1$ is preferably an aryl group (preferably a phenyl group) substituted with an amino group at the para-position. In this case, $D_1$ is preferably a group represented by the following formula (II).

The amino group may be substituted. Examples of the substituent of the amino group include the after-mentioned substituent W, and an aliphatic hydrocarbon group (preferably an alkyl group which may be substituted), an aryl group (preferably a phenyl group which may be substituted) and a heterocyclic group are preferred.

The amino group is preferably an amino group substituted with two aryl groups, a so-called diaryl group-substituted amino group. In this case, $D_1$ is preferably a group represented by the following formula (III).

Moreover, the substituent (preferably an alkyl or alkenyl group which may be substituted) of the amino group may combine with a hydrogen atom or a substituent in the aromatic ring (preferably benzene ring) structure of the aryl group substituted with an amino group at the para-position, to form a ring (preferably a 6-membered ring).

Formula (II):

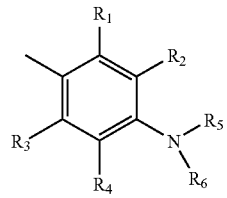

In formula (II), each of $R_1$ to $R_6$ independently represents a hydrogen atom or a substituent, and $R_1$ and $R_2$, $R_3$ and $R_4$, $R_5$ and $R_6$, $R_2$ and $R_5$, or $R_4$ and $R_6$ may combine together to form a ring.

Formula (III):

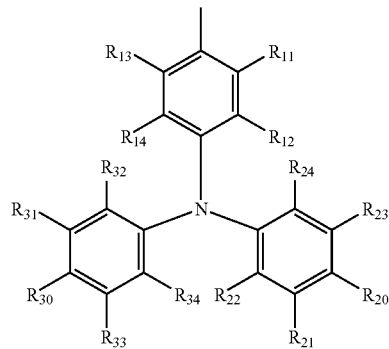

In formula (III), each of $R_{11}$ to $R_{14}$, $R_{20}$ to $R_{24}$ and $R_{30}$ to $R_{34}$ independently represents a hydrogen atom or a substituent, and respective members out of $R_{11}$ to $R_{14}$, $R_{20}$ to $R_{24}$, and $R_{30}$ to $R_{34}$ may combine together to form a ring.

In the case where each of $R^a$ and $R^b$ is an aliphatic hydrocarbon group, an aryl group or a heterocyclic group, the substituent is preferably an alkyl group, an alkenyl group, an aryl group, an alkoxy group, an aryloxy group, an acyl group, an alkoxycarbonyl group, an aryloxycarbonyl group, an acylamino group, a sulfonylamino group, a sulfonyl group, a silyl group or an aromatic heterocyclic group, more preferably an alkyl group, an alkenyl group, an aryl group, an alkoxy group, an aryloxy group, a silyl group or an aromatic heterocyclic group, still more preferably an alkyl group, an aryl group, an alkoxy group, an aryloxy group, a silyl group or an aromatic heterocyclic group. As for specific examples, those described later as the substituent W may be applied.

Each of $R^a$ and $R^b$ is preferably an alkyl group, an aryl group or an aromatic heterocyclic group. Each of $R^a$ and $R^b$ is more preferably an alkyl group, an alkylene group forming a ring by combining with L, or an aryl group, still more preferably an alkyl group having a carbon number of 1 to 8, an alkylene group forming a 5- or 6-membered ring by combining with L, or a substituted or unsubstituted phenyl group, yet still more preferably an alkyl group having a carbon number of 1 to 8, or a substituted or unsubstituted phenyl group.

It is also preferred that $D_1$ is represented by the following formula (VII).

Formula (VII):

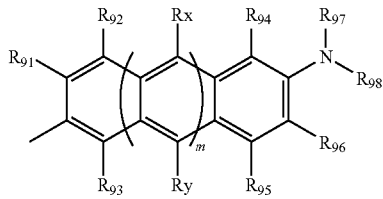

In formula (VII), each of $R_{91}$ to $R_{98}$ independently represents a hydrogen atom or a substituent; m represents an integer of 0 or more, and m is preferably 0 or 1; each of Rx and Ry independently represents a hydrogen atom or a substituent and when m is an integer of 2 or more, Rx's or Ry's bonded to respective 6-membered rings may be different substituents; $R_{91}$ and $R_{92}$, $R_{92}$ and Rx, Rx and $R_{94}$, $R_{94}$ and $R_{97}$, $R_{93}$ and Ry, Ry and $R_{95}$, $R_{95}$ and $R_{96}$, or $R_{97}$ and $R_{98}$ may independently combine together to form a ring; and the bonding part to $L_3$ (when n is 0, to $L_1$) may be the position of $R_{91}$, $R_{92}$ or $R_{93}$ and in this case, the substituent or hydrogen atom corresponding to $R_{91}$, $R_{92}$ or $R_{93}$ may be bonded to the site denoted as the bonding part to $L_3$ in formula (VII) and adjacent R's may combine together to form a ring. The expression "adjacent R's may combine together to form a ring" as used herein indicates that, for example, in the case where $R_{91}$ is the bonding part to $L_3$ (when n is 0, to $L_1$), assuming that $R_{90}$ is bonded to the bonding part of formula (VII), $R_{90}$ and $R_{93}$ may combine to form a ring; in the case where $R_{92}$ is the bonding part to $L_3$ (when n is 0, to $L_1$), assuming that $R_{90}$ is bonded to the bonding part of formula (VII), $R_{90}$ and $R_{91}$, or $R_{90}$ and $R_{93}$ may combine together to form a ring; and in the case where $R_{93}$ is the bonding part to $L_3$ (when n is 0, to $L_1$), assuming that $R_{90}$ is bonded to the bonding part of formula (VII), $R_{90}$ and $R_{91}$, or $R_{91}$ and $R_{92}$ may combine together to form a ring. The ring above is preferably a benzene ring.

Examples of the substituent of $R_{91}$ to $R_{98}$, Rx and Ry include the substituent W.

All of $R_{91}$ to $R_{96}$ are preferably a hydrogen atom, and both Rx and Ry are preferably a hydrogen atom. It is preferred that $R_{91}$ to $R_{96}$ are a hydrogen atom and at the same time, Rx and Ry are a hydrogen atom.

Each of $R_{97}$ and $R_{98}$ is independently, preferably a phenyl group which may be substituted, and examples of the substituent include the substituent W, with an unsubstituted phenyl group being preferred.

m represents an integer of 0 or more and is preferably 0 or 1.

It is also preferred that $D_1$ is a group represented by formula (VIII), (IX) or (X).

Formula (VIII):

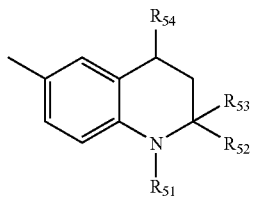

In formula (VIII), each of $R_{51}$ to $R_{54}$ independently represents hydrogen or a substituent. Examples of the substituent include the substituent W. $R_{52}$ and $R_{53}$, or $R_{51}$ and $R_{52}$ may combine together to form a ring.

Formula (IX):

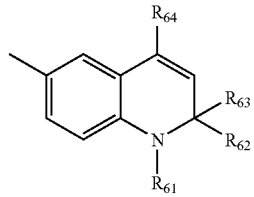

In formula (IX), each of $R_{61}$ to $R_{64}$ independently represents hydrogen or a substituent. Examples of the substituent include the substituent W. $R_{62}$ and $R_{63}$, or $R_{61}$ and $R_{62}$ may combine together to form a ring.

Formula (X):

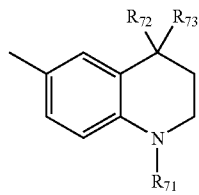

In formula (X), each of $R_{71}$ to $R_{73}$ independently represents hydrogen or a substituent. Examples of the substituent include the substituent W. $R_{72}$ and $R_{73}$ may combine together to form a ring.

$D_1$ is more preferably a group represented by formula (II) or (III).

In formula (II), each of $R_1$ to $R_6$ independently represents a hydrogen atom or a substituent, and $R_1$ and $R_2$, $R_3$ and $R_4$, $R_5$ and $R_6$, $R_2$ and $R_5$, or $R_4$ and $R_6$ may combine together to form a ring.

Examples of the substituent in $R_1$ to $R_4$ include the substituent W. Preferably, $R_1$ to $R_4$ are a hydrogen atom, or $R_2$ and $R_5$, or $R_4$ and $R_6$ form a 5-membered ring, and more preferably, all of $R_1$ to $R_4$ are a hydrogen atom.

Examples of the substituent in $R_5$ and $R_6$ include the substituent W. Among the substituents, a substituted or unsubstituted aryl group is preferred. The substituent of the substituted aryl is preferably an alkyl group (e.g., methyl, ethyl) or an aryl group (e.g., phenyl, naphthylene, phenanthryl, anthryl). Each of $R_5$ and $R_6$ is preferably a phenyl group, an alkyl-substituted phenyl group, a phenyl-substituted phenyl group, a naphthylene group, a phenanthryl group, an anthryl group, or a fluorenyl group (preferably 9,9'-dimethyl-2-fluorenyl group).

In formula (III), each of $R_{11}$ to $R_{14}$, $R_{20}$ to $R_{24}$ and $R_{30}$ to $R_{34}$ independently represents a hydrogen atom or a substituent. Also, respective members out of $R_{11}$ to $R_{14}$, $R_{20}$ to $R_{24}$ and $R_{30}$ to $R_{34}$ may combine together to form a ring. Examples of the ring formation include a case where $R_{11}$ and $R_{12}$, or $R_{13}$ and $R_{14}$ combine to form a benzene ring, a case where two adjacent members out of $R_{20}$ to $R_{24}$ ($R_{24}$ and $R_{23}$, $R_{23}$ and $R_{20}$, $R_{20}$ and $R_{21}$, or $R_{21}$ and $R_{22}$) combine to form a benzene ring, a case where two adjacent members out of $R_{30}$ to $R_{34}$ ($R_{34}$ and $R_{33}$, $R_{33}$ and $R_{30}$, $R_{30}$ and $R_{31}$, or $R_{31}$ and $R_{32}$) combine to form a benzene ring, and a case where $R_{22}$ and $R_{34}$ combine to form a 5-membered ring together with the N atom.

Examples of the substituent represented by $R_{11}$ to $R_{14}$, $R_{20}$ to $R_{24}$ and $R_{30}$ to $R_{34}$ include the substituent W, and an alkyl group (e.g., methyl, ethyl) and an aryl group (e.g., phenyl, naphthyl) are preferred. Such a group may be further substituted with a substituent W (preferably an aryl group). Above all, a case where $R_{20}$ and $R_{30}$ are the above-described substituent is preferred, and a case where at the same time, the others $R_{11}$ to $R_{14}$, $R_{21}$ to $R_{24}$ and $R_{31}$ to $R_{34}$ are a hydrogen atom is more preferred.

The compound represented by formula (I) is a compound described in JP-A-2000-297068, and the compounds not described in this patent publication can also be produced according to the synthesis methods described therein.

Specific examples of the compound represented by formula (I) are set forth below, but the present invention is not limited thereto.

(1)
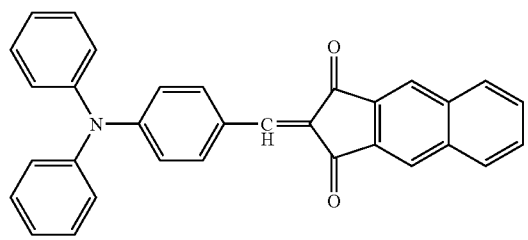

(2)
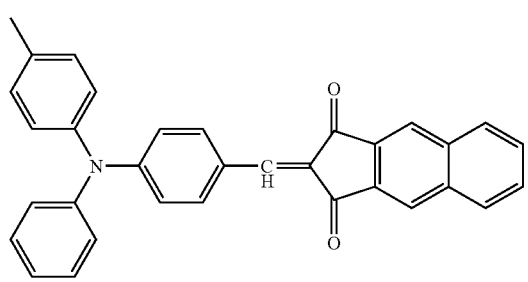

(3)
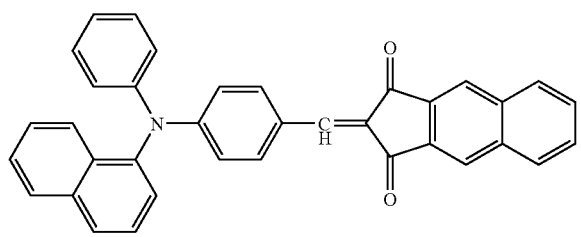

(4)
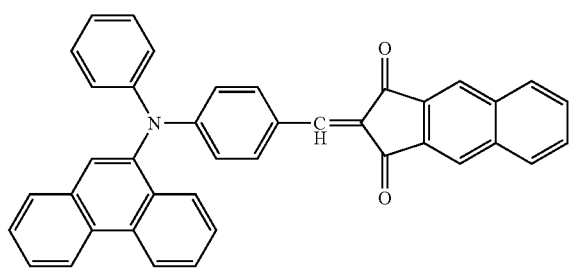

(5)
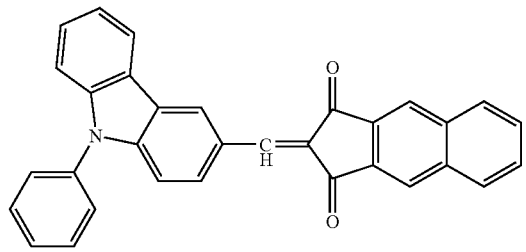

(6)
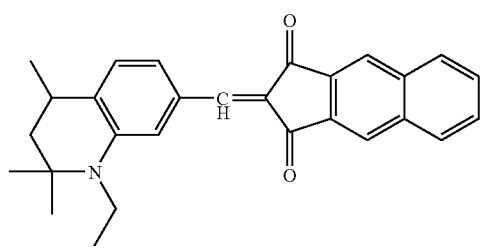

(7)
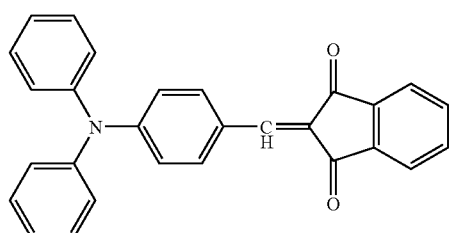

(8)
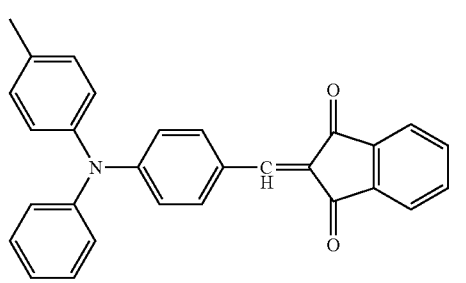

(9)
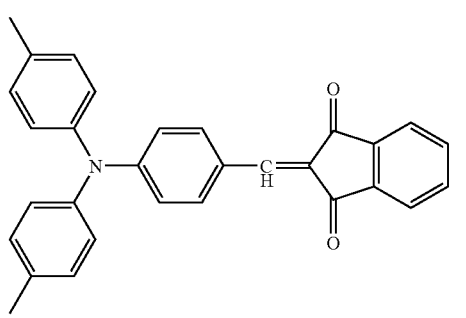

(10)
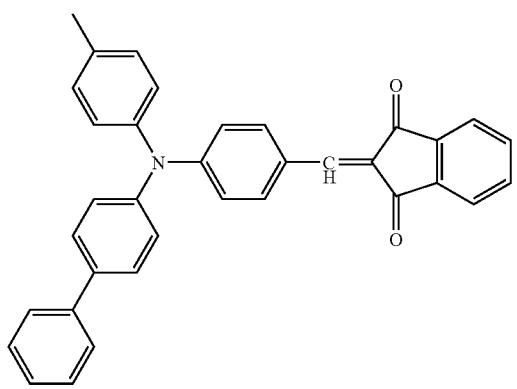
(11)
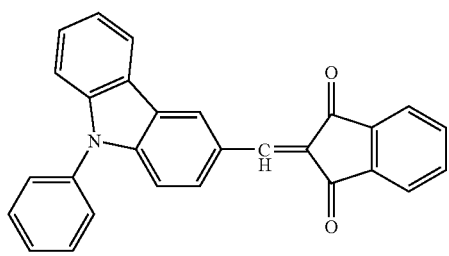
(12)
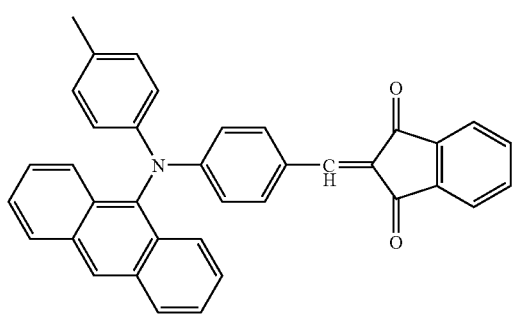
(13)
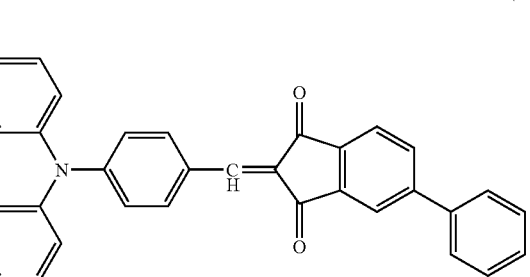
(14)
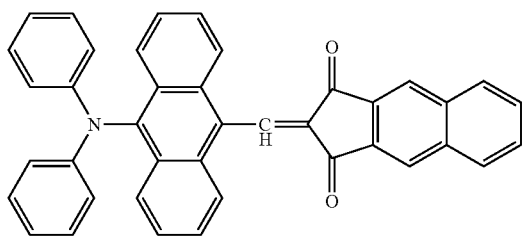
(15)
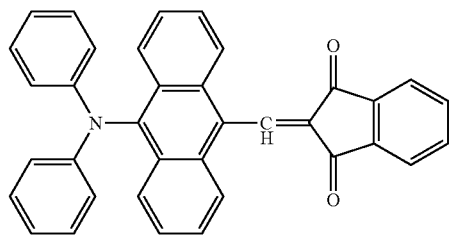
(16)
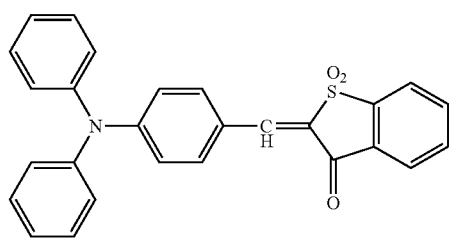
(17)
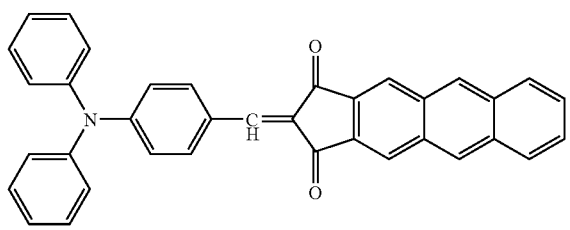
(18)
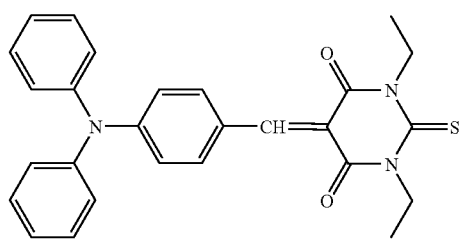
(19)
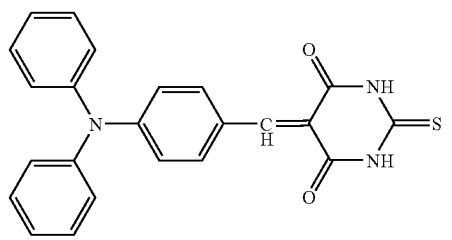
(20)
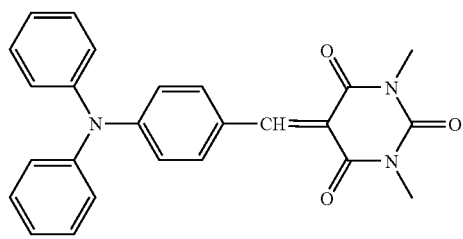

(21)
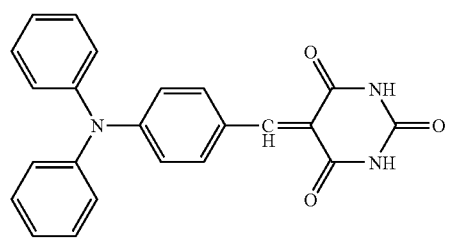
(22)
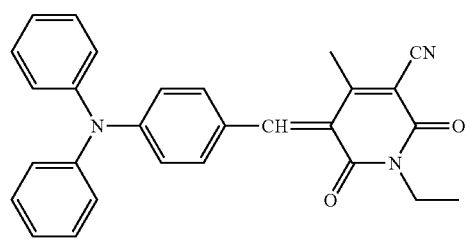
(23)
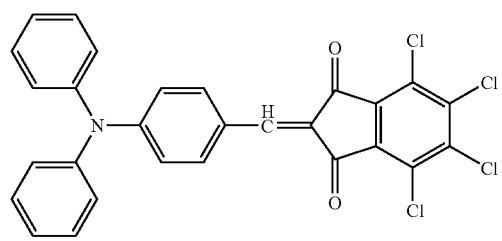
(24)
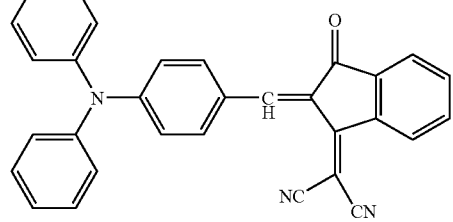
(25)
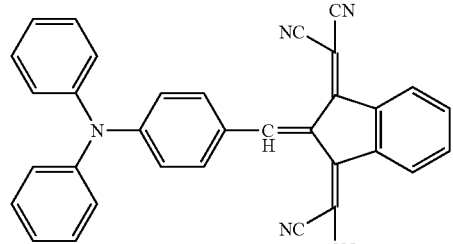
(26)
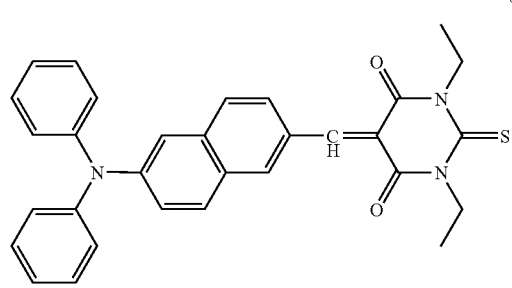
(27)
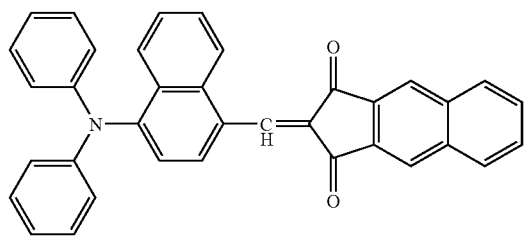
(28)
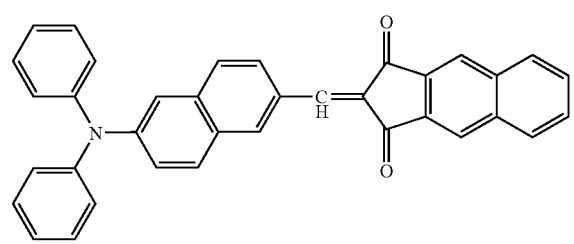
(29)
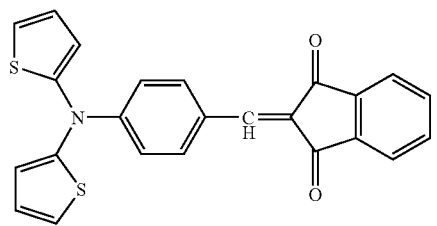
(30)
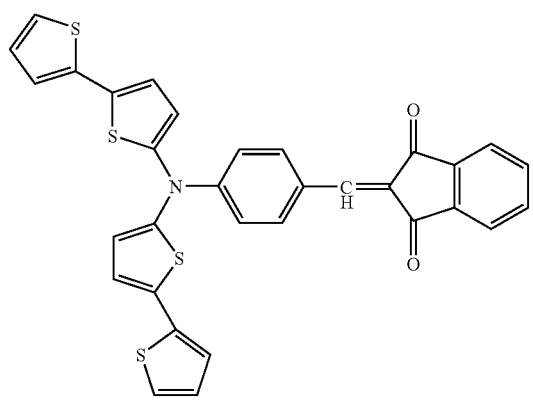
(31)
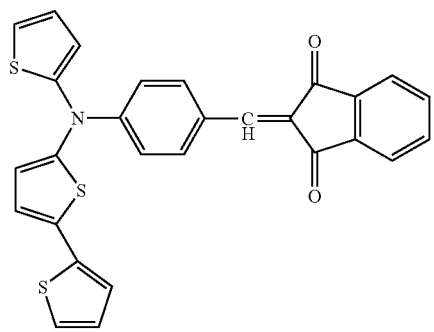

-continued
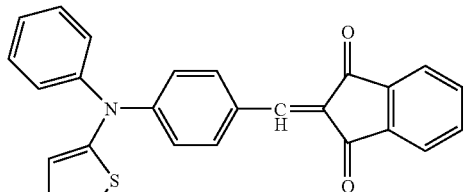
(32)
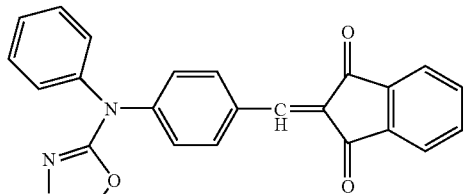
(33)
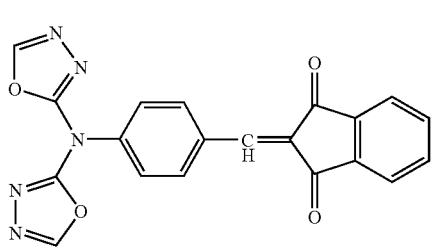
(34)
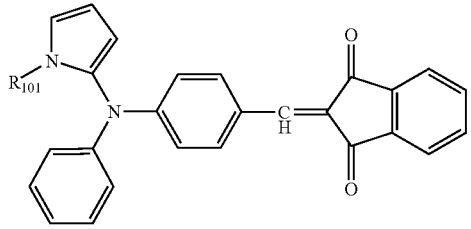
(35)
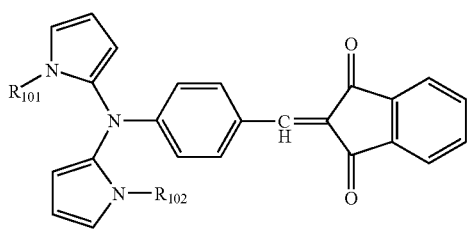
(36)
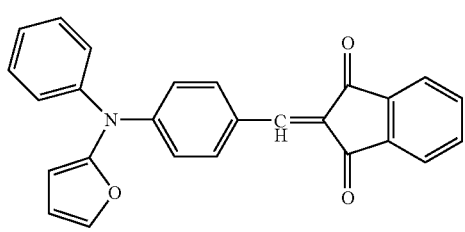
(37)
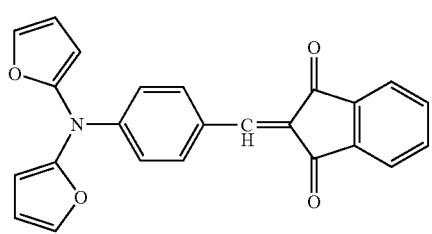
(38)
-continued
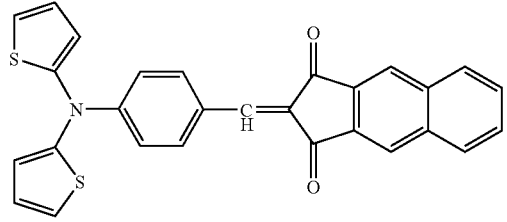
(39)
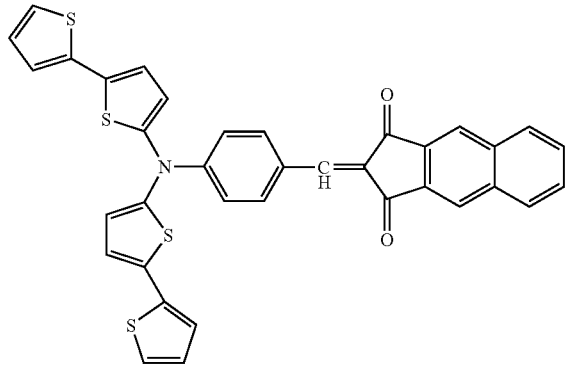
(40)
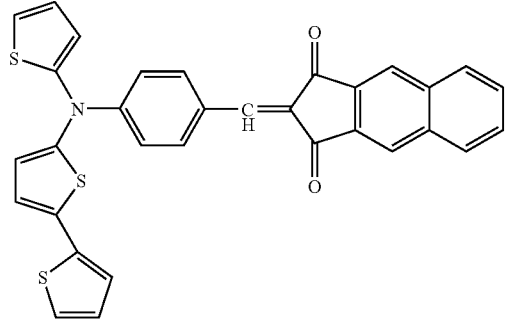
(41)
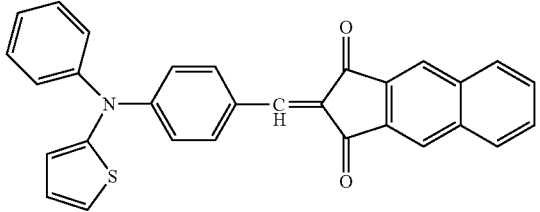
(42)
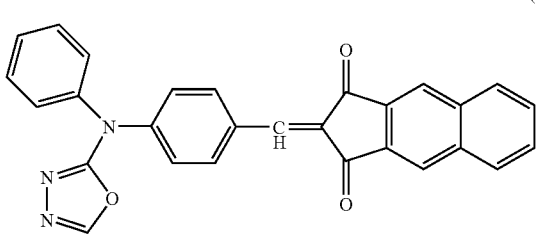
(43)

(44)
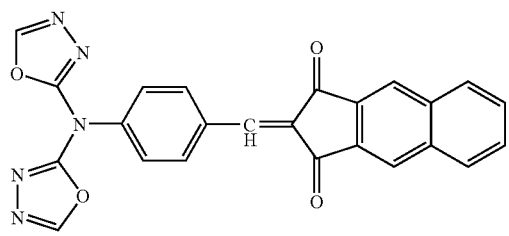
(45)
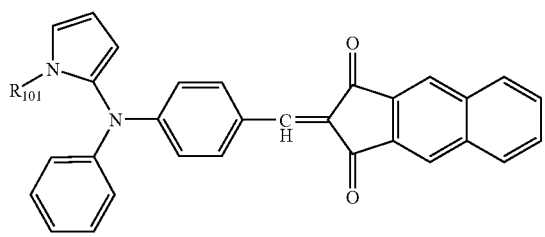
(46)
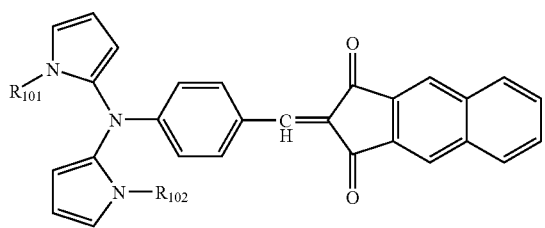
(47)
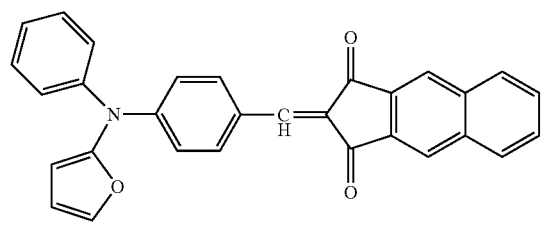
(48)
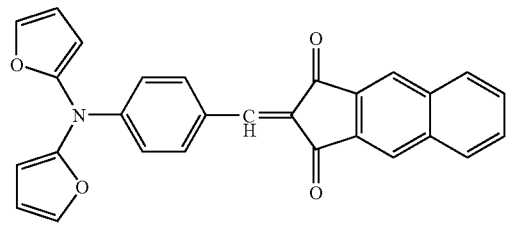
(49)
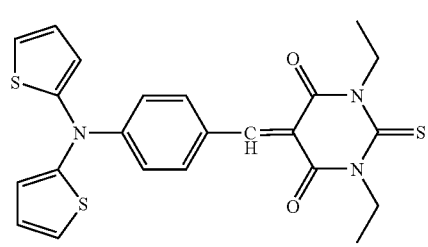
(50)
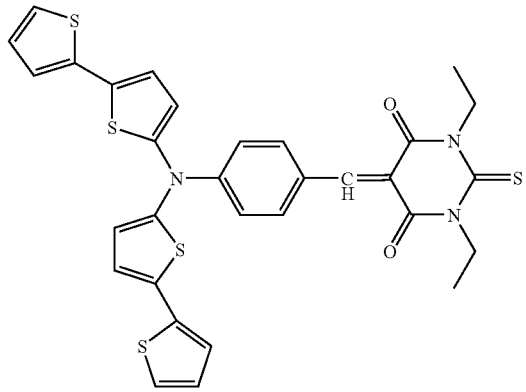
(51)
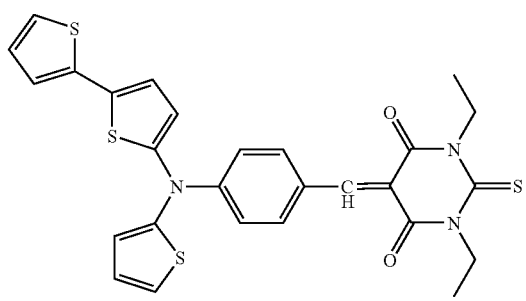
(52)
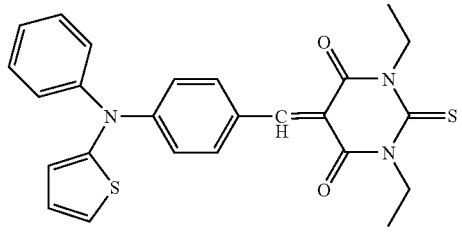
(53)
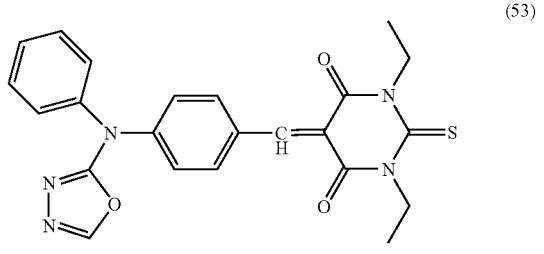
(54)
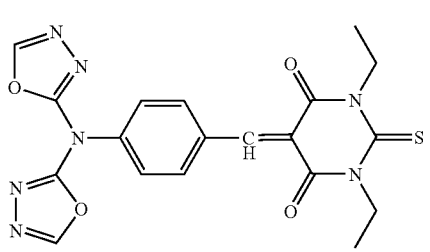

(55)
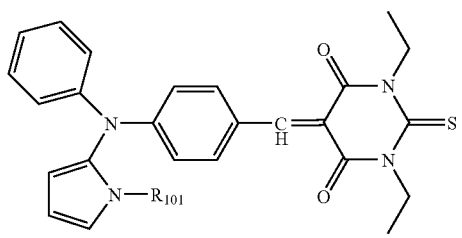
(56)
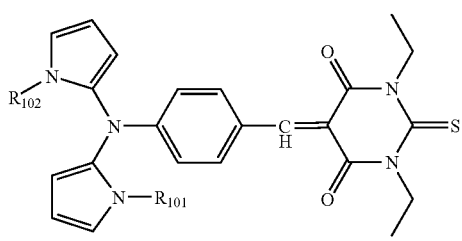
(57)
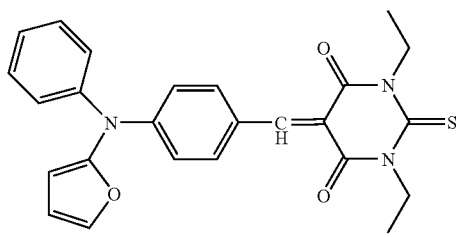
(58)
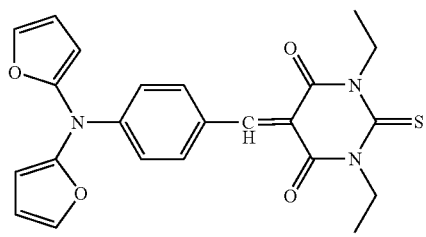
(59)
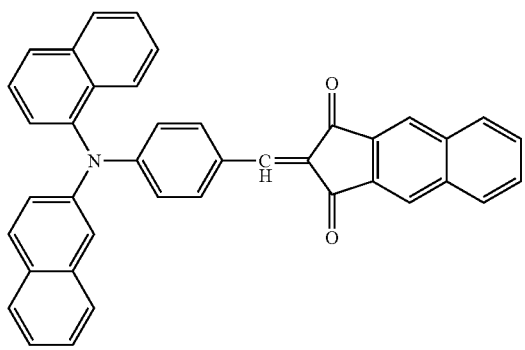
(60)
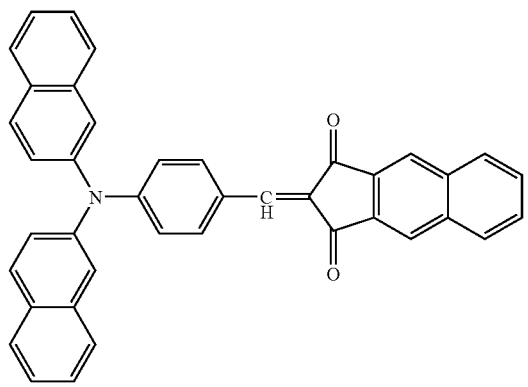
(61)
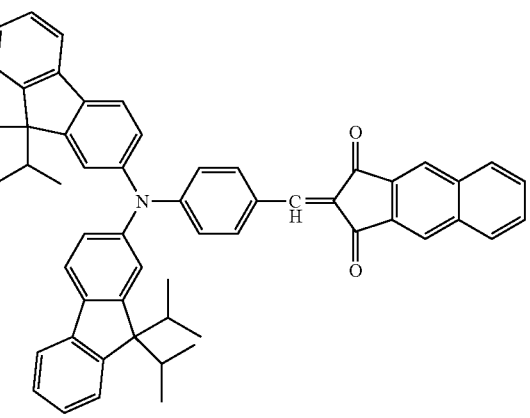
(62)
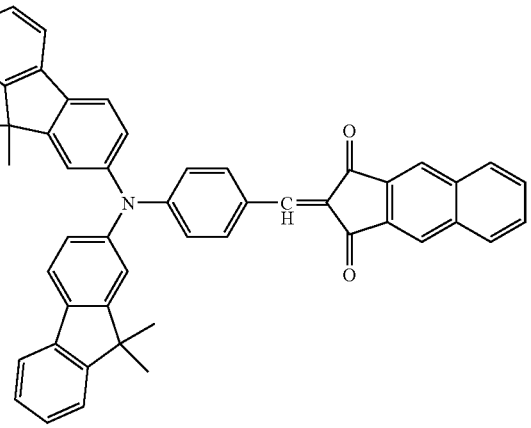

-continued

(63)
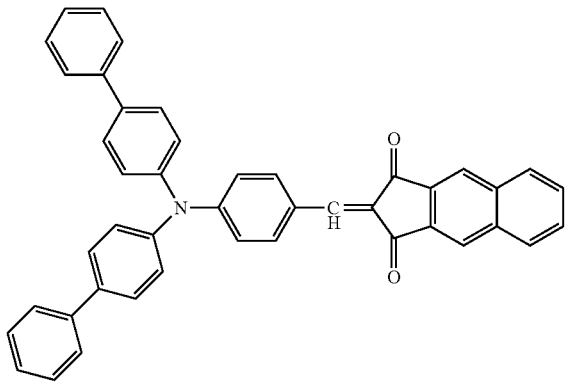

(64)
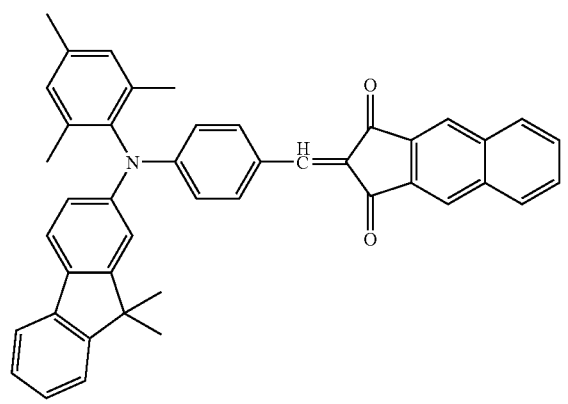

(65)
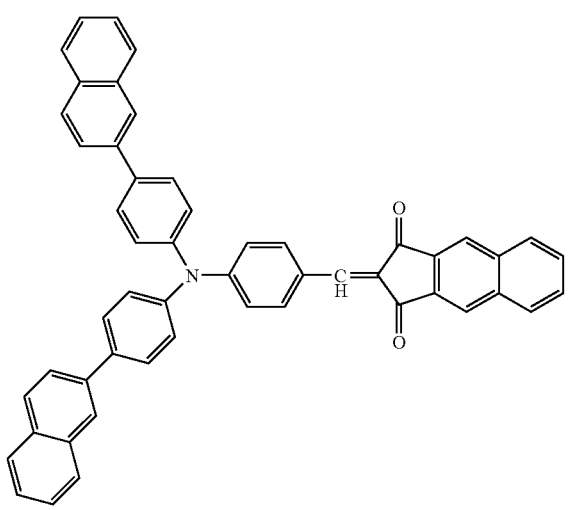

-continued

(66)
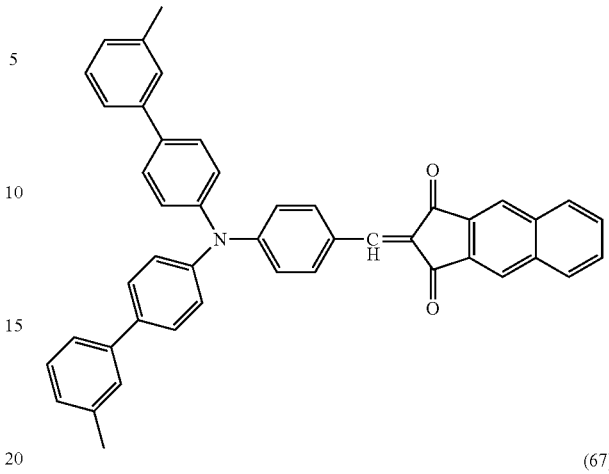

(67)
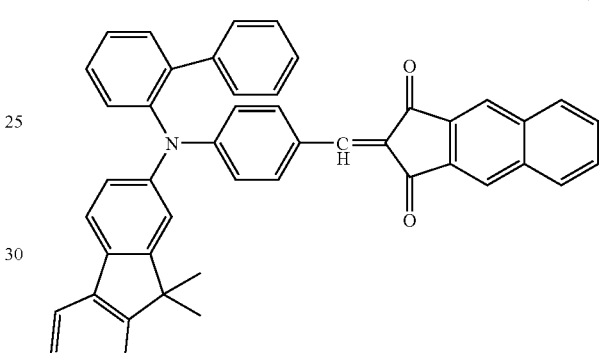

(68)
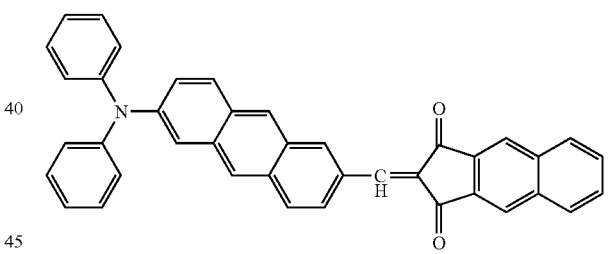

In the above, each of $R_{101}$ and $R_{102}$ independently represents a hydrogen atom or a substituent. Examples of the substituent include the substituent W, and an alkyl group and an aryl group are preferred.

The compound represented by formula (I) can be synthesized according to the method described in JP-A-2000-297068.

The photoelectric conversion layer formed of a fullerene or a fullerene derivative and the above-described photoelectric conversion material is preferably in a state where the H-aggregation propensity of the photoelectric conversion material is more elevated. By putting the photoelectric conversion layer into a state more elevated in the H-aggregation propensity of the photoelectric conversion material (a state with a smaller proportion of J-aggregation), a high photoelectric conversion efficiency can be realized.

The term "a state more enhanced in the H-aggregation propensity (a state with a smaller proportion of J-aggregation)" ("an enhancement degree of H-aggregation propensity of the photoelectric conversion layer") as used herein indicates a state where assuming that the wavelength at which the mixed layer (the mixed layer of a fullerene or a fullerene derivative and a photoelectric conversion material) deposited on the substrate shows an intensity of half of the absorbance at the maximum absorption wavelength λmax in a range of from 400 to 800 nm is $\lambda_{n1}$ ($\lambda_{max}<\lambda_{n1}$), the $\lambda_{n1}$ is made smaller by changing the deposition conditions.

The state more enhanced in the H-aggregation propensity of the photoelectric conversion material can be created by selecting an appropriate photoelectric conversion material and at the same time, appropriately controlling the content of the photoelectric conversion material in the photoelectric conversion layer, the vapor deposition rate, and the substrate temperature during deposition.

Also, the photoelectric conversion layer contains a fullerene or a fullerene derivative. The photoelectric conversion layer is preferably formed in a state where a fullerene or a fullerene derivative and at least one kind of a material except for a fullerene or a fullerene derivative are mixed or stacked.

Even when the photoelectric conversion material is a compound having low electron transportability, by forming a mixed layer of the photoelectric conversion material with a fullerene or a fullerene derivative and allowing a hole to move in the photoelectric conversion material and an electron to move in the fullerene or fullerene derivative, the low electron transportability of the photoelectric conversion material can be complemented and a high response speed can be obtained.

The fullerene indicates fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, a mixed fullerene or a fullerene nanotube.

The fullerene derivative indicates a compound obtained by adding a substituent to such a fullerene. The substituent is preferably an alkyl group, an aryl group or a heterocyclic group. The alkyl group is preferably an alkyl group having a carbon number of 1 to 12, more preferably from 1 to 5. Examples of the aryl group include a phenyl group, a naphthyl group and an anthryl group. Examples of the heterocyclic group include a furyl group, a thienyl group, a pyrrolyl group, an oxazolyl group, a pyridyl group, a quinolinyl group and a carbazolyl group.

The following compounds are preferred as the fullerene derivative.

(1)
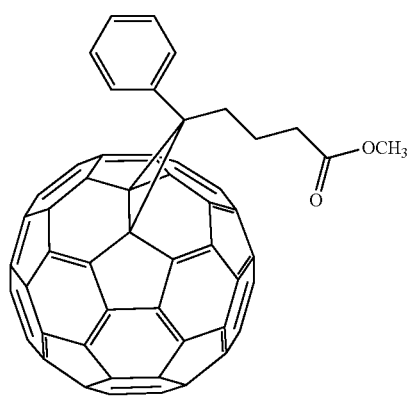

(2)
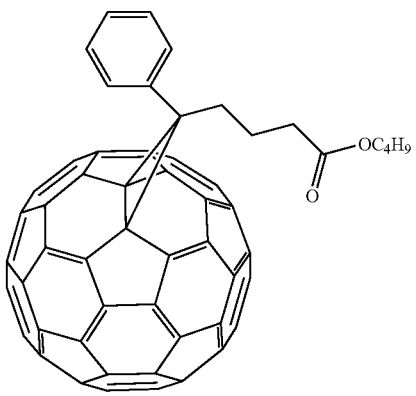

(3)
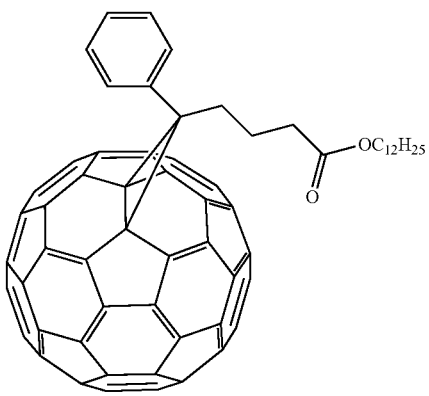

(4)
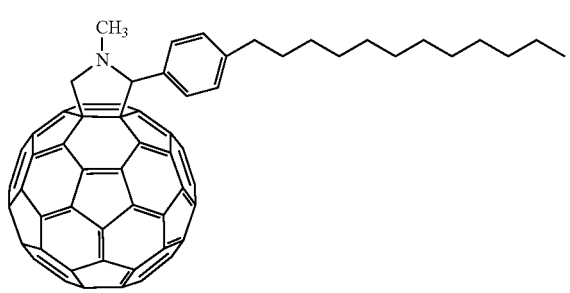

(5)
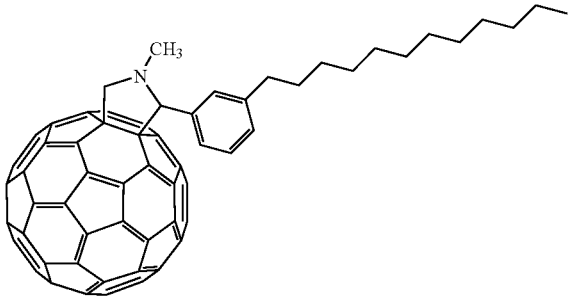

-continued

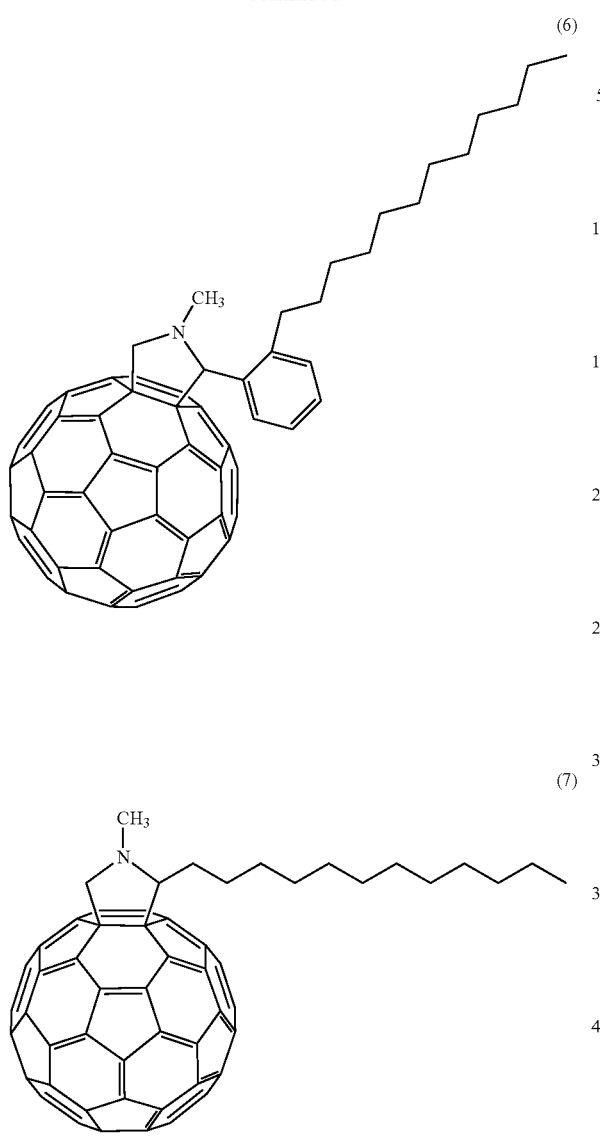

(6)

(7)

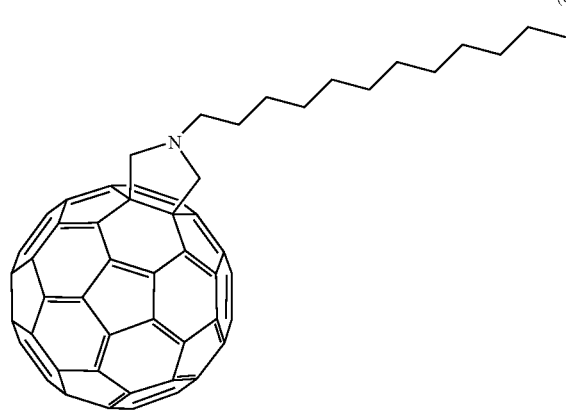

(8)

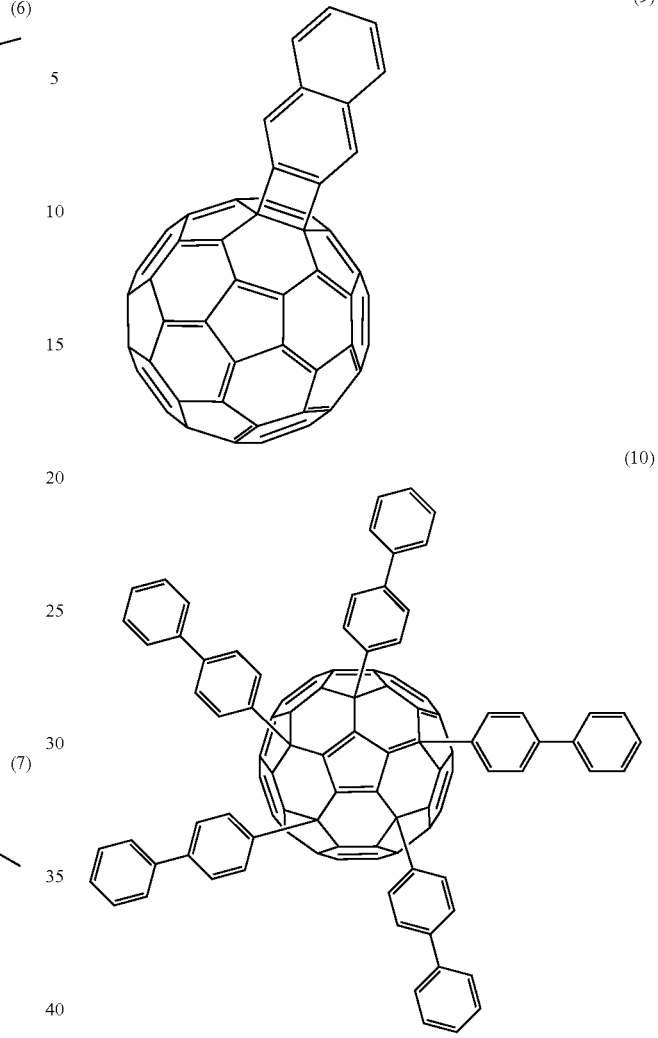

(9)

(10)

As for the fullerene and fullerene derivative, the compounds described, for example, in Kikan Kagaku Sosetsu (Scientific Review Quarterly), No. 43, edited by The Chemical Society of Japan (1999), JP-A-10-167994, JP-A-11-255508, JP-A-11-255509, JP-A-2002-241323 and JP-A-2003-196881 may also be used.

The photoelectric conversion layer is preferably in a state where at least a part of the fullerene or fullerene derivative is crystallized.

The "state where at least a part of the fullerene or fullerene derivative is crystallized in the photoelectric conversion layer" means that the fullerene or fullerene derivative is crystallized in at least a part of the photoelectric conversion layer. For example, it may be possible that the photoelectric conversion layer includes a structure where a layer portion composed of a crystallized fullerene or fullerene derivative and a layer portion composed of a nonoriented (for example, amorphous) fullerene or fullerene derivative without undergoing crystallization are stacked. The crystallized layer portion can be detected by measuring the ratio of areas where an electron beam diffraction by a cross-sectional TEM image exists.

Whether the fullerene or fullerene derivative is in a crystallized state can be judged by observing whether a crystal peak or diffraction point attributable to the crystal structure of fullerene or fullerene derivative is present in the X-ray diffraction image or cross-sectional electron-beam diffraction image of a film formed by co-depositing a fullerene or a fullerene derivative and the above-described photoelectric conversion material on a substrate.

The state where at least a part of the fullerene or fullerene derivative is crystallized makes it possible to obtain a higher photoelectric conversion efficiency and at the same time, create a state enabling effective formation of a carrier path by the fullerene or fullerene derivative and therefore, can further contribute to high-speed responsivity of the device.

The method for crystallizing at least a part of the fullerene or fullerene derivative includes, for example, a method of selecting an appropriate photoelectric conversion material and raising the ratio of fullerenes or heating the substrate during deposition.

Also, the fullerene or fullerene derivative when it is in a crystallized state is preferably oriented in the (111) direction (hereinafter sometimes referred to as "(111)-oriented") with respected to the substrate. Thanks to the (111)-orientation of the fullerene or fullerene derivative, unevenness of the photoelectric conversion film containing the fullerene or fullerene derivative is suppressed as compared with the case containing a randomly crystallized structure, as a result, the upper electrode is kept from intruding into the unevenness and coming close to the lower electrode to increase the leak current, or the flatness or coverage of a layer (for example, a charge blocking layer) deposited on the photoelectric conversion film is enhanced and in turn, the injected current is suppressed, so that a high effect of reducing the dark current can be obtained.

Whether the fullerene or fullerene derivative is in a state of being oriented in the above-described direction can be confirmed by the fact that when the photoelectric conversion layer deposited on a substrate is measured by the X-ray diffraction method, a peak of the fullerene or fullerene derivative crystal is observed and at the same time, the peak is observed only for a plurality of indices (e.g., (111), (222), (333)) in the (111) direction with respect to the direction perpendicular to the substrate.

In the layer portion, wherein the fullerene or fullerene derivative is crystallized, of the photoelectric conversion layer, the fullerene or fullerene derivative is preferably crystallized uniformly (in the same orientation direction), from 50 to 100% of the fullerene or fullerene derivative is preferably crystallized, and from 80 to 100% of the fullerene or fullerene derivative is preferably crystallized. The rate at which the fullerene or fullerene derivative is crystallized, and the rate at which the fullerene or fullerene derivative is crystallized uniformly can be determined from the ratio of peaks in the X-ray diffraction or from an electron beam diffraction by a cross-sectional TEM image.

In controlling the crystal direction of the fullerene or fullerene derivative, the above-described crystal direction can be realized also by adjusting the substrate temperature, vapor deposition rate and the like during deposition. More specifically, it is preferred to heat the substrate to a higher temperature and perform the vapor deposition at a lower rate. However, if the substrate temperature is excessively high or the vapor deposition rate is excessively low, crystallization of the fullerene or fullerene derivative may be promoted and unevenness of the film surface in the mixed layer of the fullerene or fullerene derivative and the photoelectric conversion material is sometimes increased. If the unevenness of the film surface is increased, when an electrode is laid thereon, an increase of short (leak current) is caused and the dark current disadvantageously increases.

The above-described crystal direction can be realized while suppressing an increase of the film unevenness also by varying the kind of the material except for the fullerene or fullerene derivative, present in the photoelectric conversion film, or by changing the ratio of the fullerene or fullerene derivative, and therefore, the sensitivity, high-speed responsivity and low dark current of the device become excellent.

Specifically, the content of the fullerene or fullerene derivative in the photoelectric conversion layer is preferably 50 mol % or more, more preferably 65 mol % or more, still more preferably 75 mol % or more. The upper limit of the content is preferably 90 mol %.

Furthermore, the unevenness of the film surface can be suppressed also by stacking a layer capable of relieving the film response on the mixed layer of the fullerene or fullerene derivative and the photoelectric conversion material. As for the layer capable of relieving the film response, the role to produce this effect is preferably assigned to the charge blocking layer (electron blocking layer, hole blocking layer).

Incidentally, the film surface unevenness of the mixed layer is preferably, in terms of the arithmetic mean roughness Ra, 3.0 nm or less, more preferably 2.0 nm or less.

The photoelectric conversion layer can be formed by vapor deposition. The vapor deposition may be either physical vapor deposition (PVD) or chemical vapor deposition (CVD), but physical vapor deposition such as vacuum deposition is preferred. In the case of depositing film by vacuum deposition, the production conditions such as vacuum degree and deposition temperature can be set according to conventional methods.

Also, at the formation of the photoelectric conversion layer, a fullerene or a fullerene derivative and a photoelectric conversion material having an absorption spectrum satisfying at least either the condition (A) or (B) are preferably co-deposited in a state of heating the substrate.

The substrate temperature is preferably 120° C. or less, more preferably 100° C. for less, though this may vary depending on the kind of the material except for the fullerene or fullerene derivative, present in the photoelectric conversion film, the content ratio of the fullerene or fullerene derivative, and the like. The lower limit of the substrate temperature is preferably 60° C. or more, more preferably 70° C. or more. By controlling the substrate temperature as above, the fullerene or fullerene derivative can be advantageously (111)-oriented uniformly with respect to the substrate.

The vapor deposition rate is preferably from 0.1 to 15 Å/s, and in view of more enhancing the H-aggregation propensity of the photoelectric conversion material, more preferably from 0.5 to 3.0 Å/s, though this may vary depending on the kind of the material except for the fullerene or fullerene derivative, present in the photoelectric conversion film, the content ratio of the fullerene or fullerene derivative, and the like.

(Charge Blocking Layer)

The photoelectric conversion device of the present invention preferably has a charge blocking layer as described above. By having a charge blocking layer, the dark current can be more unfailingly reduced.

The charge blocking layer (16A, 16B) can be formed by vapor deposition. The vapor deposition may be either physical vapor deposition (PVD) or chemical vapor deposition (CVD), but physical vapor deposition such as vacuum deposition is preferred. In the case of depositing film by vacuum deposition, the production conditions such as vacuum degree and deposition temperature can be set according to conventional methods.

The thickness of the charge blocking layer is preferably from 10 to 300 nm, more preferably from 30 to 150 nm, still more preferably from 50 to 100 nm With a thickness of 10 nm or more, a suitable dark current-reducing effect is obtained, and with a thickness of 300 nm or less, a suitable photoelectric conversion efficiency is obtained.

(Material for Formation of Charge Blocking Layer)

The material for forming the charge blocking layer (hole blocking layer, electron blocking layer) includes the following materials. For the hole blocking layer, an electron-accepting organic material may be used.

Examples of the electron-accepting material which can be used include an oxadiazole derivative such as 1,3-bis(4-tert-butylphenyl-1,3,4-oxadiazolyl)phenylene (OXD-7); an anthraquinodimethane derivative; a diphenylquinone derivative; bathocuproine, bathophenanthroline and their derivatives; a triazole compound; a tris(8-hydroxyquinolinato)aluminum complex; a bis(4-methyl-8-quinolinato)aluminum complex; a distyrylarylene derivative; and a silole compound. Also, a material having satisfactory electron transportability can be used even if it is not an electron-accepting organic material. A porphyrin-based compound, a styryl-based compound such as DCM (4-dicyanomethylene-2-methyl-6-(4-(dimethylaminostyryl)-4H-pyrane), and a 4H-pyrane-based compound can be used.

Specifically, the following compounds are preferred. In specific examples below, Ea indicates the electron affinity (eV) of the material, and Ip indicates the ionization potential (eV) of the material.

HB-1: Ea = 3.5, Ip = 6.2

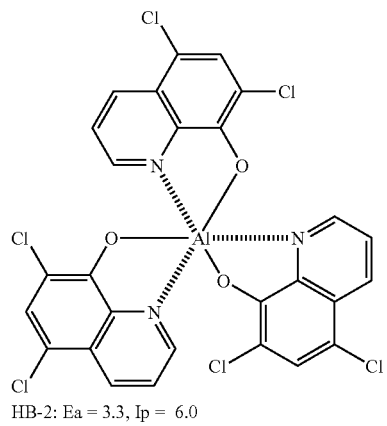

HB-2: Ea = 3.3, Ip = 6.0

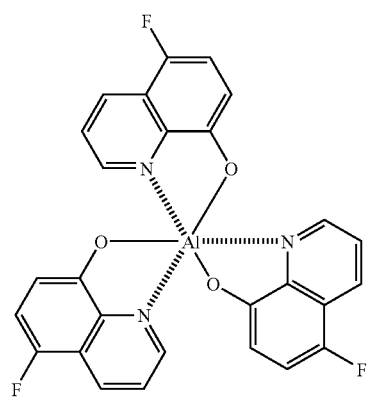

HB-3: Ea = 3.7, Ip = 7.2

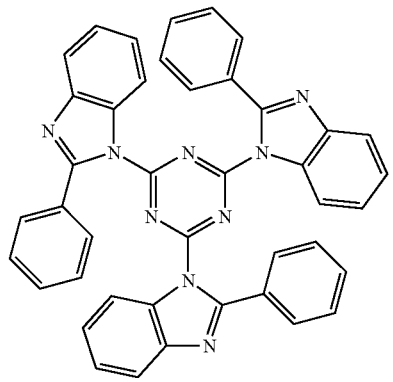

HB-4: Ea = 3.6, Ip = 7.6

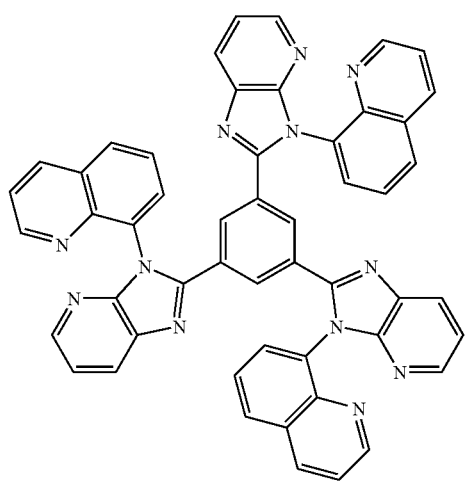

HB-5: Ea = 3.6, Ip = 7.6

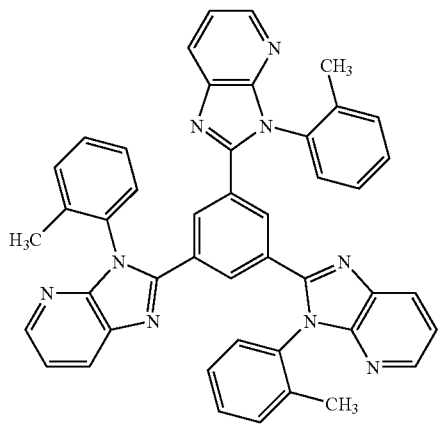

BCP: Ea = 3.2, Ip = 6.7

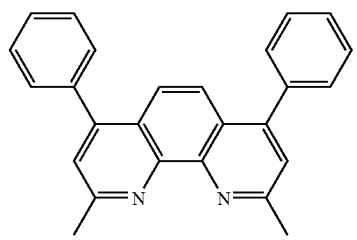

For the electron-blocking layer, an electron-donating organic material can be used.

More specifically, examples of the low molecular material which can be used include an aromatic diamine compound such as N,N'-bis(3-methylphenyl)-(1,1'-biphenyl)-4,4'-diamine (TPD) and 4,4'-bis[N-(naphthyl)-N-phenylamino]biphenyl (α-NPD), oxazole, oxadiazole, triazole, imidazole, imidazolone, a stilbene derivative, a pyrazoline derivative, tetrahydroimidazole, a polyarylalkane, butadiene, 4,4',4''-tris(N-(3-methylphenyl)N-phenylamino)triphenylamine (m-MTDATA), a porphyrin compound such as porphin, copper tetraphenylporphin, phthalocyanine, copper phthalocyanine and titanium phthalocyanine oxide, a triazole derivative, an oxadiazole derivative, an imidazole derivative, a polyarylalkane derivative, a pyrazoline derivative, a pyrazolone derivative, a phenylenediamine derivative, an anilamine derivative, an amino-substituted chalcone derivative, an oxazole derivative, a styrylanthracene derivative, a fluorenone derivative, a hydrazone derivative, and a silazane derivative. As for the polymer material, a polymer such as phenylenevinylene, fluorene, carbazole, indole, pyrene, pyrrole, picolin, thiophene, acetylene and diacetylene, or a derivative thereof may be used. A compound having sufficient hole transportability may be used even if it is not an electron-donating compound.

Specifically, the following compounds are preferred.

EB-1: Ea = 1.9, Ip = 4.9

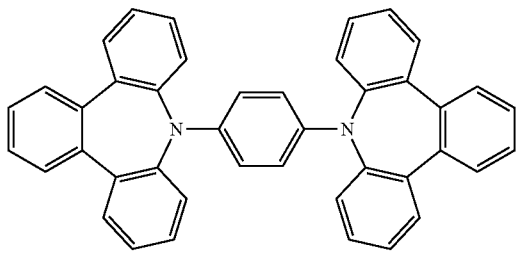

EB-2: Ea = 1.7, Ip = 4.7

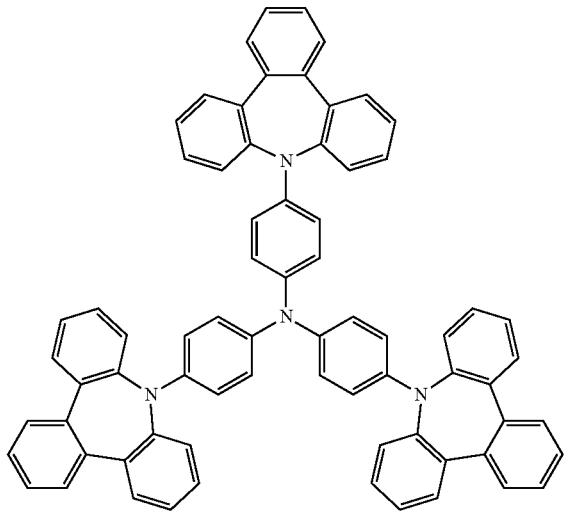

EB-3: Ea = 1.9, Ip = 5.2

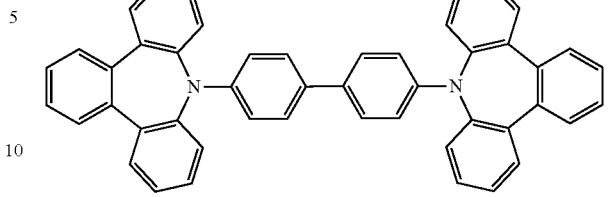

EB-4: Ea = 2.1, Ip = 5.4

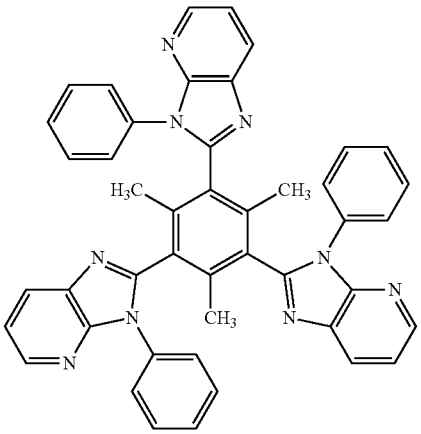

EB-5: Ea = 2.1, Ip = 5.8

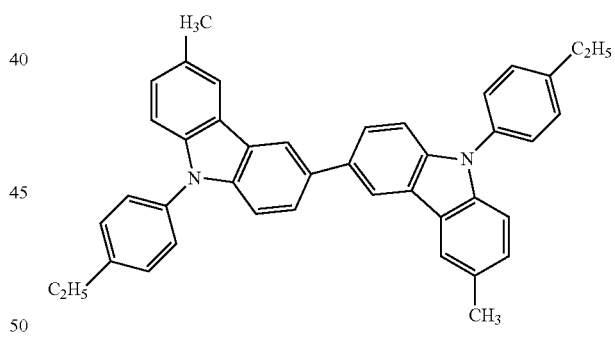

TPD: Ea = 2.3, Ip = 5.5

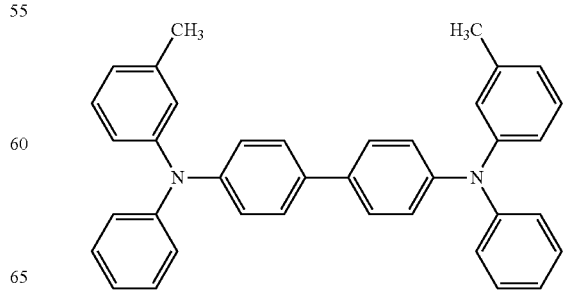

-continued m-MTDATA: Ea = 1.9, Ip = 5.1

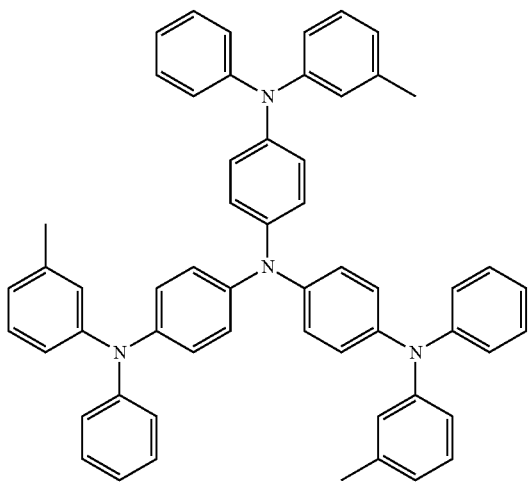

[Imaging Device]

Configuration examples of an imaging device equipped with the photoelectric conversion device are described below. In the following configuration examples, the members and the like having the same configuration/action as the members described above are indicated by the same or like symbols or numerical references in the figure, and their description is simplified or omitted.

(First Configuration Example of Imaging Device)

Figure 3:
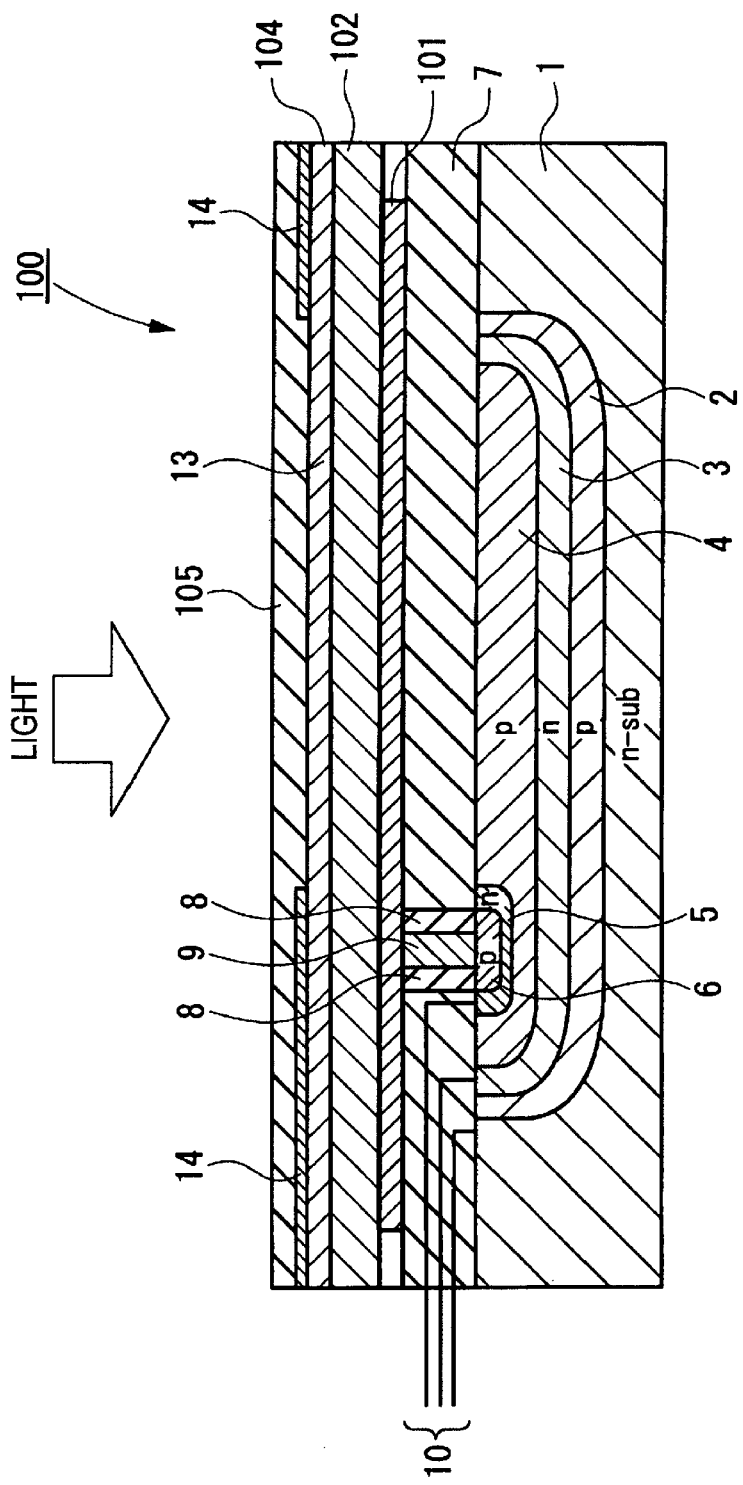
FIG. 3 is a schematic cross-sectional view of one pixel portion of an imaging device.

FIG. 3 is a cross-sectional schematic view of one pixel portion of an imaging device.

In the imaging device 100, a large number of pixels each constituting one pixel are disposed in an array manner on the same plane, and one-pixel data of the image data can be produced by the signal obtained from the one pixel.

One pixel of the imaging device shown in FIG. 3 is composed of an n-type silicon substrate 1, a transparent insulating film 7 formed on the n-type silicon substrate 1, and a photoelectric conversion device consisting of a lower electrode 101 formed on the insulating film 7, a photoelectric conversion layer 102 formed on the lower electrode 101 and a transparent electrode material-containing upper electrode 104 formed on the photoelectric conversion layer 102. A light-shielding film 14 having provided therein an opening is formed on the photoelectric conversion device, and a transparent insulating film 105 is formed on the upper electrode 104. Here, it is also preferred that the light-shielding film 14 is of the type formed in the insulating film 7.

Inside of the n-type silicon substrate 1, a p-type impurity region (hereinafter simply referred to as "p region") 4, an n-type impurity region (hereinafter simply referred to as "n region") 3, and a p region 2 are formed in order of increasing the depth. In the p region 4, a high-concentration p region 6 is formed in the surface part of the portion light-shielded by the light-shielding film 14, and the p region 6 is surrounded by an n region 5.

The depth of the pn junction plane between the p region 4 and the n region 3 from the surface of the n-type silicon substrate 1 is set to a depth at which blue light is absorbed (about 0.2 μm). Therefore, the p region 4 and the n region 3 form a photodiode (B photodiode) of absorbing blue light and accordingly accumulating electric charges.

The depth of the pn junction plane between the p region 2 and the n-type silicon substrate 1 from the surface of the n-type silicon substrate 1 is set to a depth at which red light is absorbed (about 2 μm). Therefore, the p region 2 and the n-type silicon substrate 1 form a photodiode (R photodiode) of absorbing red light and accordingly accumulating electric charges.

The p region 6 is a charge accumulation part for accumulating an electric charge of the photoelectric conversion layer 102 and is electrically connected to the lower electrode 101 via a connection part 9 formed in the opening bored through the insulating film 7. A hole trapped by the lower electrode 101 recombines with an electron in the p region 6 and therefore, the number of electrons accumulated in the p region 6 on resetting decreases according to the number of holes trapped. The connection part 9 is electrically insulated by an insulating film 8 from portions except for the lower electrode 101 and the p region 6.

The electrons accumulated in the p region 2 are converted into signals according to the electric charge amount by an MOS circuit (not shown) composed of a p-channel MOS transistor formed inside of the n-type silicon substrate 1, the electrons accumulated in the p region 4 are converted into signals according to the electric charge amount by an MOS circuit (not shown) composed of a p-channel MOS transistor formed inside of the n region 3, the electrons accumulated in the p region 6 are converted into signals according to the electric charge amount by an MOS circuit (not shown) composed of a p-channel MOS transistor formed inside of the n region 5, and these signals are output to the outside of the imaging device 100. Each MOS circuit is connected to a signal read-out pad (not shown) by a wiring 10. Incidentally, when an extractor electrode is provided in the p region 2 and p region 4 and a predetermined reset potential is applied, each region is depleted and the capacitance of each pn junction part becomes an infinitely small value, whereby the capacitance produced in the junction plane can be made extremely small.

Thanks to such a configuration, G light can be photoelectrically converted by the photoelectric conversion layer 102, and B light and R light can be photoelectrically converted by the B photodiode and the R photodiode, respectively, in the n-type silicon substrate 1. Also, since G light is first absorbed in the upper part, excellent color separation is achieved between B-G and between G-R. This is a greatly excellent point in comparison with an imaging device of the type where three PDs are stacked inside of a silicon substrate and all of BGR lights are separated inside of the silicon substrate. Incidentally, the imaging device may be of the type where electrons are trapped in the lower electrode 101 by reversing the assignment of p type and n type to the substrate 1 and the regions 2 to 6. The imaging device may also be of the type where regions 2 and 3 are omitted, a color filter is formed on or below the insulating film 105 so as to perform color separation of BGR by the color filter, light coming under each pixel is photoelectrically converted in the photoelectrically conversion layer 102, and lights of BGR are detected by respective pixels. In this case, the lower electrode 101 preferably passes none of BGR lights, and, for example, Al, Mo or TiN is preferably used.

(Second Configuration Example of Imaging Device)

In this embodiment, instead of a configuration where two photodiodes are stacked inside of a silicon substrate 1 as in the imaging device of FIG. 3, two diodes are arrayed in the direction perpendicular to the incident direction of incident light so that lights of two colors can be detected in the inside of the p-type silicon substrate.

Figure 4:
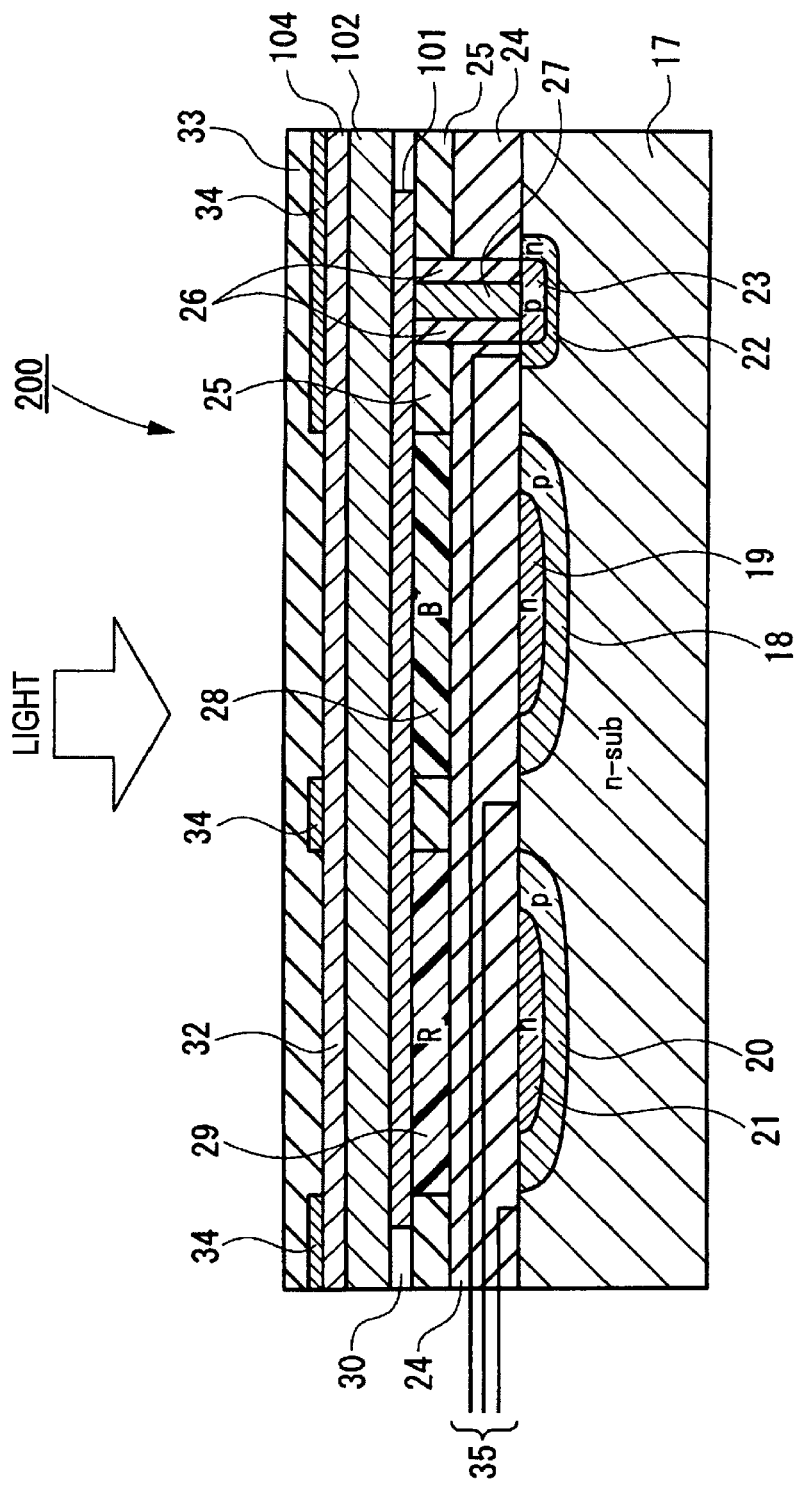
FIG. 4 is a schematic cross-sectional view of one pixel portion of an imaging device in another configuration example.

FIG. 4 is a cross-sectional schematic view of one pixel portion of an imaging device of this configuration example.

Here, similarly to the imaging device example of FIG. 3, the imaging device may be fabricated in type where electrons are trapped in the lower electrode 101 by reversing the assignment of p type and n type to respective regions in FIG. 4.

One pixel of the imaging device 200 shown in FIG. 4 is composed of an n-type silicon substrate 17 and a photoelectric conversion device consisting of a lower electrode 101 formed above the n-type silicon substrate 17, a photoelectric conversion layer 102 formed on the lower electrode 101, and an upper electrode 104 formed on the photoelectric conversion layer 102. A light-shielding film 34 having provided therein an opening is formed on the photoelectric conversion device, and a transparent insulating film 33 is formed on the upper electrode 104. Here, it is also preferred that the light-shielding part 34 is of the type formed in the insulating film 24.

On the surface of the n-type silicon substrate 17 below the opening of the light-shielding film 34, a photodiode consisting of an n region 19 and a p region 18 and a photodiode consisting of an n region 21 and a p region 20 are formed to lie in juxtaposition on the surface of the n-type silicon substrate 17. An arbitrary plane direction on the n-type silicon substrate 17 surface becomes the direction perpendicular to the incident direction of incident light.

Above the photodiode consisting of an n region 19 and a p region 18, a color filter 28 capable of transmitting B light is formed via a transparent insulating film 24, and the lower electrode 101 is formed thereon. Above the photodiode consisting of an n region 21 and a p region 20, a color filter 29 capable of transmitting R light is formed via the transparent insulating film 24, and the lower electrode 101 is formed thereon. The peripheries of color filters 28 and 29 are covered with a transparent insulating film 25.

The photodiode consisting of an n region 19 and a p region 18 functions as an in-substrate photoelectric conversion part that absorbs B light transmitted through the color filter 28, accordingly generates electrons and accumulates the generated electrons in the p region 18. The photodiode consisting of an n region 21 and a p region 20 functions as an in-substrate photoelectric conversion part that absorbs R light transmitted through the color filter 29, accordingly generates electrons and accumulates the generated holes in the p region 20.

In the portion light-shielded by the light-shielding film 34 on the n-type silicon substrate 17 surface, a p region 23 is formed, and the periphery of the p region 23 is surrounded by an n region 22.

The p region 23 is electrically connected to the lower electrode 101 via a connection part 27 formed in the opening bored through the insulating films 24 and 25. A hole trapped by the lower electrode 101 recombines with an electron in the p region 23 and therefore, the number of electrons accumulated in the p region 23 on resetting decreases according to the number of holes trapped. The connection part 27 is electrically insulated by an insulating film 26 from portions except for the lower electrode 101 and the p region 23.

The electrons accumulated in the p region 18 are converted into signals according to the electric charge amount by an MOS circuit (not shown) composed of a p-channel MOS transistor formed inside of the n-type silicon substrate 17, the electrons accumulated in the p region 20 are converted into signals according to the electric charge amount by an MOS circuit (not shown) composed of a p-channel MOS transistor formed inside of the n-type silicon substrate 17, the electrons accumulated in the p region 23 are converted into signals according to the electric charge amount by an MOS circuit (not shown) composed of an n-channel MOS transistor formed inside of the n region 22, and these signals are output to the outside of the imaging device 200. Each MOS circuit is connected to a signal read-out pad (not shown) by a wiring 35.

In this connection, instead of MOS circuits, the signal read-out part may be composed of CCD and an amplifier, that is, may be a signal read-out part where electrons accumulated in the p region 18, p region 20 and p region 23 are read out into CCD formed inside of the n-type silicon substrate 17 and then transferred to an amplifier by the CCD and signals according to the electrons transferred are output from the amplifier.

In this way, the signal read-out part includes a CCD structure and a CMOS structure, but in view of power consumption, high-speed read-out, pixel addition, partial read-out and the like, CMOS is preferred.

Incidentally, in the imaging device of FIG. 4, color separation of R light and B light is performed by color filters 28 and 29, but instead of providing color filters 28 and 29, the depth of the pn junction plane between the p region 20 and the n region 21 and the depth of the pn junction plane between the p region 18 and the n region 19 each may be adjusted to absorb R light and B light by respective photodiodes.

An inorganic photoelectric conversion part composed of an inorganic material that absorbs light transmitted through the photoelectric conversion layer 102, accordingly generates electric charges and accumulates the electric charges, may also be formed between the n-type silicon substrate 17 and the lower electrode 101 (for example, between the insulating film 24 and the n-type silicon substrate 17). In this case, an MOS circuit for reading out signals according to the electric charges accumulated in a charge accumulation region of the inorganic photoelectric conversion part may be provided inside of the n-type silicon substrate 17, and a wiring 35 may be connected also to this MOS circuit.

Also, there may take a configuration where one photodiode is provided inside of the n-type silicone substrate 17 and a plurality of photoelectric conversion parts are stacked above the n-type silicon substrate 17; a configuration where a plurality of photodiodes are provided inside of the n-type silicon substrate 17 and a plurality of photoelectric conversion parts are stacked above the n-type silicon substrate 17; or when a color image need not be formed, a configuration where one photodiode is provided inside of the n-type silicon substrate 17 and only one photoelectric conversion part is stacked.

(Third Configuration Example of Imaging Device)

The imaging device of this embodiment is configured such that a photodiode is not provided inside of the silicon substrate and a plurality of (here, three) photoelectric conversion devices are stacked above the silicon substrate.

Figure 5:
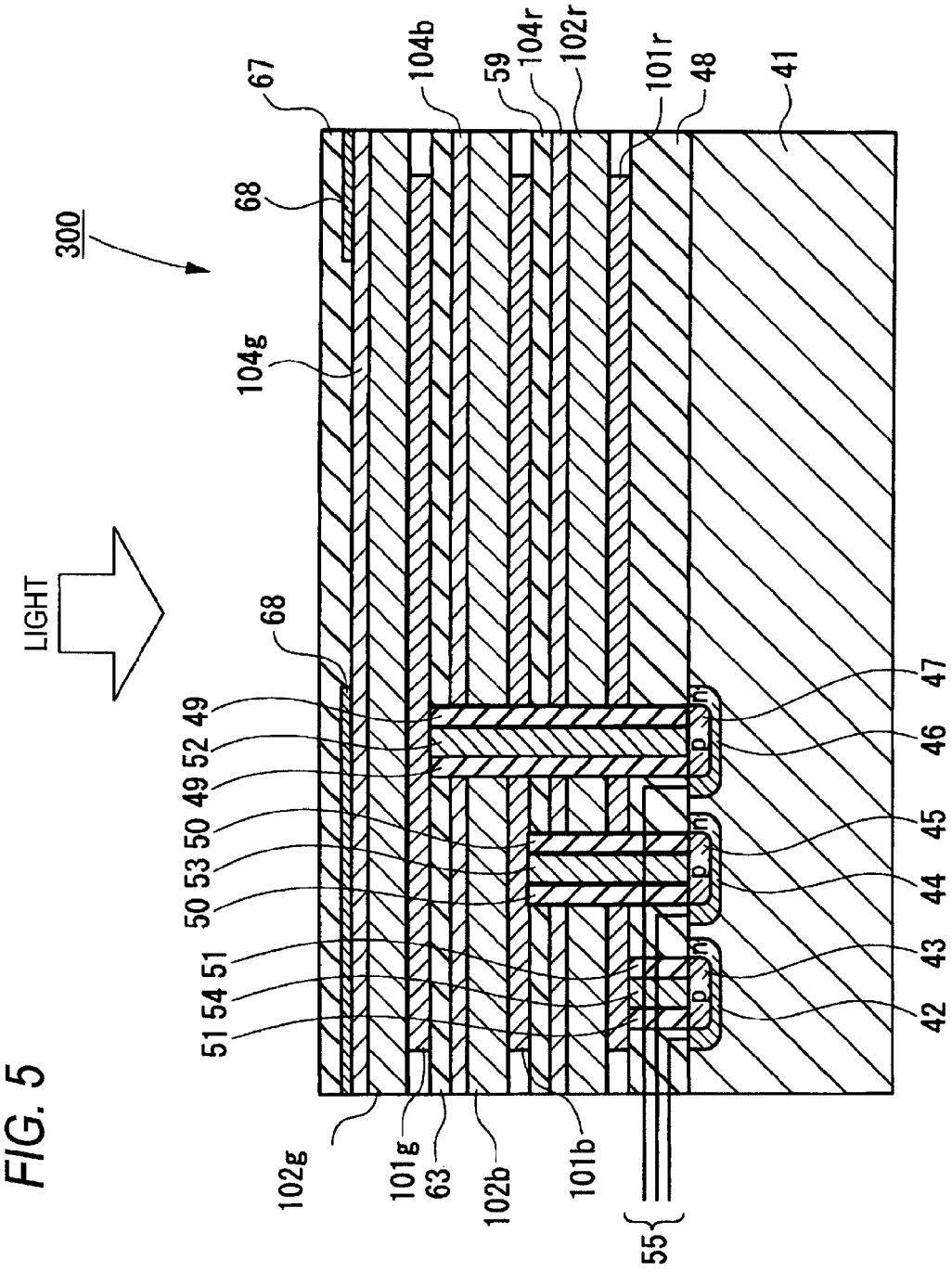
FIG. 5 is a schematic cross-sectional view of one pixel portion of an imaging device in another configuration example.

FIG. 5 is a cross-sectional schematic view of one pixel portion of the imaging device of this embodiment. Here, similarly to the imaging device examples of FIGS. 3 and 4, the imaging device may be fabricated in type where electrons are trapped in the lower electrodes 101r, 101g and 101b by reversing the assignment of p type and n type to respective regions 42 to 47 in FIG. 5.

The imaging device 300 shown in FIG. 5 has a configuration where an R photoelectric conversion device, a B photoelectric conversion device, and a G photoelectric conversion device are stacked in order above a silicon substrate 41.

The R photoelectric conversion device is composed of, above the silicon substrate 41, a lower electrode 101r, a photoelectric conversion layer 102r formed on the lower electrode 101r, and an upper electrode 104r formed on the photoelectric conversion layer 102r.

The B photoelectric conversion device is composed of a lower electrode 101b stacked on the upper electrode 104r of the R photoelectric conversion device, a photoelectric conversion layer 102b formed on the lower electrode 101b, and an upper electrode 104b formed on the photoelectric conversion layer 102b.

The G photoelectric conversion device is composed of a lower electrode 101g stacked on the upper electrode 104b of the B photoelectric conversion device, a photoelectric conversion layer 102g formed on the lower electrode 101g, and an upper electrode 104g formed on the photoelectric conversion layer 102g. The imaging device of this configuration example has a configuration where the R photoelectric conversion device, the B photoelectric conversion device and the G photoelectric conversion device are stacked in this order.

A transparent insulating film 59 is formed between the upper electrode 104r of the R photoelectric conversion device and the lower electrode 101b of the B photoelectric conversion device, and a transparent insulating film 63 is formed between the upper electrode 104b of the B photoelectric conversion device and the lower electrode 101g of the G photoelectric conversion device. A light-shielding film 68 is formed in the region excluding an opening on the upper electrode 104g of the G photoelectric conversion device, and a transparent insulating film 67 is formed to cover the upper electrode 104g and the light-shielding film 68.

The lower electrode, the photoelectric conversion layer and the upper electrode contained in each of the R, G and B photoelectric conversion devices can have the same configuration as that in the photoelectric conversion device described above. However, the photoelectric conversion layer 102g contains an organic material capable of absorbing green light and accordingly generating electrons and holes, the photoelectric conversion layer 102b contains an organic material capable of absorbing blue light and accordingly generating electrons and holes, and the photoelectric conversion layer 102r contains an organic material capable of absorbing red light and accordingly generating electrons and holes.

In the portion light-shielded by the light-shielding film 68 on the silicon substrate 41 surface, p regions 43, 45 and 47 are formed, and the peripheries of these regions are surrounded by n regions 42, 44 and 46, respectively.

The p region 43 is electrically connected to the lower electrode 101r via a connection part 54 formed in an opening bored through an insulating film 48. A hole trapped by the lower electrode 101r recombines with an electron in the p region 43 and therefore, the number of electrons accumulated in the p region 43 on resetting decreases according to the number of holes trapped. The connection part 54 is electrically insulated by an insulating film 51 from portions except for the lower electrode 101r and the p region 43.

The p region 45 is electrically connected to the lower electrode 101b via a connection part 53 formed in an opening bored through the insulating film 48, the R photoelectric conversion device and the insulating film 59. A hole trapped by the lower electrode 101b recombines with an electron in the p region 45 and therefore, the number of electrons accumulated in the p region 45 on resetting decreases according to the number of holes trapped. The connection part 53 is electrically insulated by an insulating film 50 from portions except for the lower electrode 101b and the p region 45.

The p region 47 is electrically connected to the lower electrode 101g via a connection part 52 formed in an opening bored through the insulating film 48, the R photoelectric conversion device, the insulating film 59, the B photoelectric conversion device and the insulating film 63. A hole trapped by the lower electrode 101g recombines with an electron in the p region 47 and therefore, the number of electrons accumulated in the p region 47 on resetting decreases according to the number of holes trapped. The connection part 52 is electrically insulated by an insulating film 49 from portions except for the lower electrode 101g and the p region 47.

The electrons accumulated in the p region 43 are converted into signals according to the electric charge amount by an MOS circuit (not shown) composed of a p-channel MOS transistor formed inside of the n region 42, the electrons accumulated in the p region 45 are converted into signals according to the electric charge amount by an MOS circuit (not shown) composed of a p-channel MOS transistor formed inside of the n region 44, the electrons accumulated in the p region 47 are converted into signals according to the electric charge amount by an MOS circuit (not shown) composed of a p-channel MOS transistor formed inside of the n region 46, and these signals are output to the outside of the imaging device 300. Each MOS circuit is connected to a signal read-out pad (not shown) by a wiring 55. Incidentally, instead of MOS circuits, the signal read-out part may be composed of CCD and an amplifier, that is, may be a signal read-out part where electrons accumulated in the p regions 43, 45 and 47 are read out into CCD formed inside of the silicon substrate 41 and then transferred to an amplifier by the CCD and signals according to the electrons transferred are output from the amplifier.

In the description above, the photoelectric conversion layer capable of absorbing B light means a layer which can absorb at least light at a wavelength of 400 to 500 nm and in which the absorption factor at a peak wavelength in the wavelength region above is preferably 50% or more. The photoelectric conversion layer capable of absorbing G light means a layer which can absorb at least light at a wavelength of 500 to 600 nm and in which the absorption factor at a peak wavelength in the wavelength region above is preferably 50% or more. The photoelectric conversion layer capable of absorbing R light means a layer which can absorb at least light at a wavelength of 600 to 700 nm and in which the absorption factor at a peak wavelength in the wavelength region above is preferably 50% or more.

[Substituent W]

The substituent W is described below.

Examples of the substituent W include a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (may also be called a hetero ring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyl group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H) and other known substituents.

More specifically, substituent W represents, for example, the following (1) to (48):

(1) a halogen atom,
   such as fluorine atom, chlorine atom, bromine atom and iodine atom;
(2) an alkyl group,
   specifically a linear, branched or cyclic, substituted or unsubstituted alkyl group, the alkyl group including, for example, (2-a) to (2-e):
(2-a) an alkyl group,
   preferably an alkyl group having a carbon number of 1 to 30 (e.g., methyl, ethyl, n-propyl, isopropyl, tert-butyl, n-octyl, eicosyl, 2-chloroethyl, 2-cyanoethyl, 2-ethylhexyl),
(2-b) a cycloalkyl group,
   preferably a substituted or unsubstituted cycloalkyl group having a carbon number of 3 to 30 (e.g., cyclohexyl, cyclopentyl, 4-n-dodecylcyclohexyl),
(2-c) a bicycloalkyl group,
   preferably a substituted or unsubstituted bicycloalkyl group having a carbon number of 5 to 30 (e.g., bicyclo[1,2,2]heptan-2-yl, bicyclo[2,2,2]octan-3-yl),
(2-d) a tricycloalkyl group,
   preferably a substituted or unsubstituted tricycloalkyl group having a carbon number of 7 to 30 (e.g., 1-adamantyl), and
(2-e) a polycyclic cycloalkyl group having a large number of ring structures,
   here, the alkyl group in the substituent described below (for example, the alkyl group in an alkylthio group) means an alkyl group having such a concept but further includes an alkenyl group and an alkynyl group;
(3) an alkenyl group,
   specifically a linear, branched or cyclic, substituted or unsubstituted alkenyl group, the alkenyl group including (3-a) to (3-c):
(3-a) an alkenyl group,
   preferably a substituted or unsubstituted alkenyl group having a carbon number of 2 to 30 (e.g., vinyl, allyl, prenyl, geranyl, oleyl),
(3-b) a cycloalkenyl group,
   preferably a substituted or unsubstituted cycloalkenyl group having a carbon number of 3 to 30 (e.g., 2-cyclopenten-1-yl, 2-cyclohexen-1-yl), and
(3-c) a bicycloalkenyl group,
   specifically a substituted or unsubstituted bicycloalkenyl group, preferably a substituted or unsubstituted bicycloalkenyl group having a carbon number of 5 to 30 (e.g., bicyclo[2,2,1]hept-2-en-1-yl, bicyclo[2,2,2]oct-2-en-4-yl)];
(4) an alkynyl group,
   preferably a substituted or unsubstituted alkynyl group having a carbon number of 2 to 30 (e.g., ethynyl, propargyl, trimethylsilylethynyl);
(5) an aryl group,
   preferably a substituted or unsubstituted aryl group having a carbon number of 6 to 30 (e.g., phenyl, p-tolyl, naphthyl, m-chlorophenyl, o-hexadecanoylaminophenyl, ferrocenyl);
(6) a heterocyclic group,
   preferably a monovalent group obtained by removing one hydrogen atom from a 5- or 6-membered substituted or unsubstituted, aromatic or non-aromatic heterocyclic compound, more preferably a 5- or 6-membered aromatic heterocyclic group having a carbon number of 2 to 50 (e.g., 2-furyl, 2-thienyl, 2-pyrimidinyl, 2-benzothiazolyl; the heterocyclic group may also be a cationic heterocyclic group such as 1-methyl-2-pyridinio and 1-methyl-2-quinolinio);
(7) a cyano group;
(8) a hydroxy group;
(9) a nitro group;
(10) a carboxyl group;
(11) an alkoxy group,
   preferably a substituted or unsubstituted alkoxy group having a carbon number of 1 to 30 (e.g., methoxy, ethoxy, isopropoxy, tert-butoxy, n-octyloxy, 2-methoxyethoxy);
(12) an aryloxy group,
   preferably a substituted or unsubstituted aryloxy group having a carbon number of 6 to 30 (e.g., phenoxy, 2-methylphenoxy, 4-tert-butylphenoxy, 3-nitrophenoxy, 2-tetradecanoylaminophenoxy);
(13) a silyloxy group,
   preferably a silyloxy group having a carbon number of 3 to 20 (e.g., trimethylsilyloxy, tert-butyldimethylsilyloxy);
(14) a heterocyclic oxy group,
   preferably a substituted or unsubstituted heterocyclic oxy group having a carbon number of 2 to 30 (e.g., 1-phenyltetrazol-5-oxy, 2-tetrahydropyranyloxy);
(15) an acyloxy group,
   preferably a formyloxy group, a substituted or unsubstituted alkylcarbonyloxy group having a carbon number of 2 to 30, or a substituted or unsubstituted arylcarbonyloxy group having a carbon number of 6 to 30 (e.g., formyloxy, acetyloxy, pivaloyloxy, stearoyloxy, benzoyloxy, p-methoxyphenylcarbonyloxy);
(16) a carbamoyloxy group,
   preferably a substituted or unsubstituted carbamoyloxy group having a carbon number of 1 to 30 (e.g., N,N-dimethylcarbamoyloxy, N,N-diethylcarbamoyloxy, morpholinocarbonyloxy, N,N-di-n-octylaminocarbonyloxy, N-n-octylcarbamoyloxy);
(17) an alkoxycarbonyloxy group,
   preferably a substituted or unsubstituted alkoxycarbonyloxy group having a carbon number of 2 to 30 (e.g., methoxycarbonyloxy, ethoxycarbonyloxy, tert-butoxycarbonyloxy, n-octylcarbonyloxy);
(18) an aryloxycarbonyloxy group,
   preferably a substituted or unsubstituted aryloxycarbonyloxy group having a carbon number of 7 to 30 (e.g., phenoxycarbonyloxy, p-methoxyphenoxycarbonyloxy, p-n-hexadecyloxyphenoxycarbonyloxy);
(19) an amino group,
   preferably an amino group, a substituted or unsubstituted alkylamino group having a carbon number of 1 to 30, or a substituted or unsubstituted anilino group having a carbon number of 6 to 30, such as amino, methylamino, dimethylamino, anilino, N-methyl-anilino and diphenylamino;
(20) an ammonio group,
   preferably an ammonio group or an ammonio group substituted with a substituted or unsubstituted alkyl, aryl or heterocyclic group, having a carbon number of 1 to 30 (e.g., trimethylammonio, triethylammonio, diphenylmethylammonio);
(21) an acylamino group,
   preferably a formylamino group, a substituted or unsubstituted alkylcarbonylamino group having a carbon number of 1 to 30, or a substituted or unsubstituted arylcarbonylamino group having a carbon number of 6 to 30, such as formylamino, acetylamino, pivaloylamino, lauroylamino, benzoylamino and 3,4,5-tri-n-octyloxyphenylcarbonylamino;
(22) an aminocarbonylamino group,
   preferably a substituted or unsubstituted aminocarbonylamino group having a carbon number of 1 to 30 (e.g., carbamoylamino, N,N-dimethylaminocarbonylamino, N,N-diethylaminocarbonylamino, morpholinocarbonylamino);
(23) an alkoxycarbonylamino group, preferably a substituted or unsubstituted alkoxycarbonylamino group having a carbon number of 2 to 30 (e.g., methoxycarbonylamino, ethoxycarbonylamino, tert-butoxycarbonylamino, n-octadecyloxycarbonylamino, N-methylmethoxycarbonylamino);

(24) an aryloxycarbonylamino group, preferably a substituted or unsubstituted aryloxycarbonylamino group having a carbon number of 7 to 30 (e.g., phenoxycarbonylamino, p-chlorophenoxycarbonylamino, m-n-octyloxyphenoxycarbonylamino);

(25) a sulfamoylamino group, preferably a substituted or unsubstituted sulfamoylamino group having a carbon number of 0 to 30 (e.g., sulfamoylamino, N,N-dimethylaminosulfonylamino, N-n-octylaminosulfonylamino);

(26) an alkyl- or aryl-sulfonylamino group, preferably a substituted or unsubstituted alkylsulfonylamino group having a carbon number of 1 to 30, or a substituted or unsubstituted arylsulfonylamino group having a carbon number of 6 to 30, such as methylsulfonylamino, butylsulfonylamino, phenylsulfonylamino, 2,3,5-trichlorophenylsulfonylamino and p-methylphenylsulfonylamino;

(27) a mercapto group;

(28) an alkylthio group, preferably a substituted or unsubstituted alkylthio group having a carbon number of 1 to 30 (e.g., methylthio, ethylthio, n-hexadecylthio);

(29) an arylthio group, preferably a substituted or unsubstituted arylthio group having a carbon number of 6 to 30 (e.g., phenylthio, p-chlorophenylthio, m-methoxyphenylthio);

(30) a heterocyclic thio group, preferably a substituted or unsubstituted heterocyclic thio group having a carbon number of 2 to 30 (e.g., 2-benzothiazolylthio, 1-phenyltetrazol-5-ylthio);

(31) a sulfamoyl group, preferably a substituted or unsubstituted sulfamoyl group having a carbon number of 0 to 30 (e.g., N-ethylsulfamoyl, N-(3-dodecyloxypropyl)sulfamoyl, N,N-dimethylsulfamoyl, N-acetylsulfamoyl, N-benzoylsulfamoyl, N—(N'-phenylcarbamoyl)sulfamoyl);

(32) a sulfo group;

(33) an alkyl- or aryl-sulfinyl group, preferably a substituted or unsubstituted alkylsulfinyl group having a carbon number of 1 to 30, or a substituted or unsubstituted arylsulfinyl group having a carbon number of 6 to 30, such as methylsulfinyl, ethylsulfinyl, phenylsulfinyl and p-methylphenylsulfinyl;

(34) an alkyl- or aryl-sulfonyl group, preferably a substituted or unsubstituted alkylsulfonyl group having a carbon number of 1 to 30, or a substituted or unsubstituted arylsulfonyl group having a carbon number of 6 to 30, such as methylsulfonyl, ethylsulfonyl, phenylsulfonyl and p-methylphenylsulfonyl;

(35) an acyl group, preferably a formyl group, a substituted or unsubstituted alkylcarbonyl group having a carbon number of 2 to 30, a substituted or unsubstituted arylcarbonyl group having a carbon number of 7 to 30, or a substituted or unsubstituted heterocyclic carbonyl group having a carbon number of 4 to 30 and being bonded to a carbonyl group through a carbon atom, such as acetyl, pivaloyl, 2-chloroacetyl, stearoyl, benzoyl, p-n-octyloxyphenylcarbonyl, 2-pyridylcarbonyl and 2-furylcarbonyl;

(36) an aryloxycarbonyl group, preferably a substituted or unsubstituted aryloxycarbonyl group having a carbon number of 7 to 30 (e.g., phenoxycarbonyl, o-chlorophenoxycarbonyl, m-nitrophenoxycarbonyl, p-tert-butylphenoxycarbonyl);

(37) an alkoxycarbonyl group, preferably a substituted or unsubstituted alkoxycarbonyl group having a carbon number of 2 to 30 (e.g., methoxycarbonyl, ethoxycarbonyl, tert-butoxycarbonyl, n-octadecyloxycarbonyl);

(38) a carbamoyl group, preferably a substituted or unsubstituted carbamoyl group having a carbon number of 1 to 30 (e.g., carbamoyl, N-methylcarbamoyl, N,N-dimethylcarbamoyl, N,N-di-n-octylcarbamoyl, N-(methylsulfonyl)carbamoyl);

(39) an aryl or heterocyclic azo group, preferably a substituted or unsubstituted arylazo group having a carbon number of 6 to 30, or a substituted or unsubstituted heterocyclic azo group having a carbon number of 3 to 30, such as phenylazo, p-chlorophenylazo and 5-ethylthio-1,3,4-thiadiazol-2-ylazo;

(40) an imido group, preferably N-succinimido or N-phthalimido;

(41) a phosphino group, preferably a substituted or unsubstituted phosphino group having a carbon number of 2 to 30 (e.g., dimethylphosphino, diphenylphosphino, methylphenoxyphosphino);

(42) a phosphinyl group, preferably a substituted or unsubstituted phosphinyl group having a carbon number of 2 to 30 (e.g., phosphinyl, dioctyloxyphosphinyl, diethoxyphosphinyl);

(43) a phosphinyloxy group, preferably a substituted or unsubstituted phosphinyloxy group having a carbon number of 2 to 30 (e.g., diphenoxyphosphinyloxy, dioctyloxyphosphinyloxy);

(44) a phosphinylamino group, preferably a substituted or unsubstituted phosphinylamino group having a carbon number of 2 to 30 (e.g., dimethoxyphosphinylamino, dimethylaminophosphinylamino);

(45) a phospho group;

(46) a silyl group, preferably a substituted or unsubstituted silyl group having a carbon number of 3 to 30 (e.g., trimethylsilyl, triethylsilyl, triisopropylsilyl, tert-butyldimethylsilyl, phenyldimethylsilyl);

(47) a hydrazino group, preferably a substituted or unsubstituted hydrazino group having a carbon number of 0 to 30 (e.g., trimethylhydrazino); and

(48) a ureido group, preferably a substituted or unsubstituted ureido group having a carbon number of 0 to 30 (e.g., N,N-dimethylureido).

Also, two W's may form a ring in cooperation. Such a ring includes an aromatic or non-aromatic hydrocarbon ring, a heterocyclic ring, and a polycyclic condensed ring formed by combining these rings. Examples of the ring include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring.

Among these substituents W, those having a hydrogen atom may be deprived of the hydrogen atom and further substituted with the above-described group. Examples of such a substituent include a —CONHSO$_2$— group (sulfonylcarbamoyl group or carbonylsulfamoyl group), a —CONHCO— group (carbonylcarbamoyl group) and an —SO$_2$NHSO$_2$— group (sulfonylsulfamoyl group). Specific examples thereof include an alkylcarbonylaminosulfonyl group (e.g., acetyl amino sulfonyl), an arylcarbonylaminosulfonyl group (e.g., benzoylaminosulfonyl), an alkylsulfonylaminocarbonyl group (e.g., methylsulfonylaminocarbonyl) and an arylsulfonylaminocarbonyl group (e.g., p-methylphenylsulfonylaminocarbonyl).

EXAMPLES

Example 1

A photoelectric conversion device was produced as follows.

Amorphous ITO was deposited on a substrate by sputtering to a thickness of 30 nm to form a lower electrode. On this lower electrode, a layer formed by co-depositing Compound (1) shown below and fullerene (C$_{60}$) at a vapor deposition rate of 1.7 Å/s to a thickness of 100 nm and 300 nm, respectively, in terms of a single layer was deposited by vacuum heating deposition in a state of the substrate temperature being controlled to 25° C. to form a photoelectric conversion layer. Furthermore, TPD and mMTDATA were deposited thereon to a thickness of 20 nm and 300 nm, respectively, to form an electron blocking layer. The vacuum deposition of the photoelectric conversion layer and electron blocking layer was performed at a vacuum degree of 4×10$^{-4}$ Pa or less for all layers.

Thereafter, amorphous ITO was deposited thereon as an upper electrode by sputtering to a thickness of 10 nm to form a transparent upper electrode. In this way, a photoelectric conversion device was produced.

Example 2

A photoelectric conversion device was produced in the same manner except that in the deposition of the photoelectric conversion layer of Example 1, the co-deposited layer of Compound (1) and fullerene (C$_{60}$) was deposited at a substrate temperature of 80° C.

Example 3

A photoelectric conversion device was produced in the same manner except that in the deposition of the photoelectric conversion layer of Example 1, the co-deposited layer of Compound (1) and fullerene (C$_{60}$) was deposited at a substrate temperature of 105° C.

Example 4

A photoelectric conversion device was produced in the same manner except that in the deposition of the photoelectric conversion layer of Example 1, the co-deposited layer of Compound (1) and fullerene (C$_{60}$) was deposited at a vapor deposition rate of 13.6 Å/s.

Example 5

A photoelectric conversion device was produced in the same manner except that in the deposition of the photoelectric conversion layer of Example 1, the co-deposited layer of Compound (1) and fullerene (C$_{60}$) was deposited at a substrate temperature of −35° C.

Comparative Example 1

A photoelectric conversion device was produced in the same manner except that in the deposition of the photoelectric conversion layer of Example 1, the co-deposited layer of Compound (1) and fullerene (C$_{60}$) was changed to a co-deposited layer of Comparative Compound and fullerene (C$_{60}$).

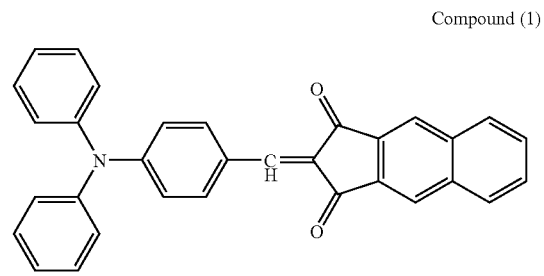

Compound (1)

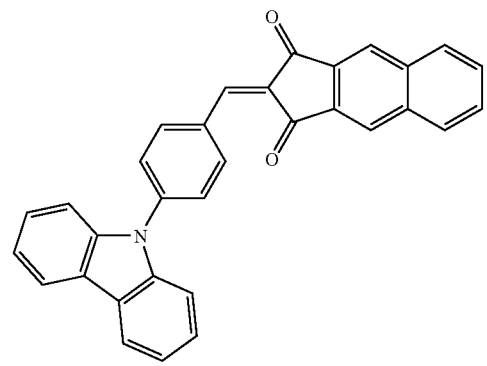

Comparative Compound

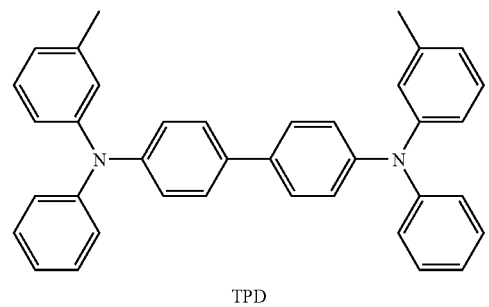

TPD

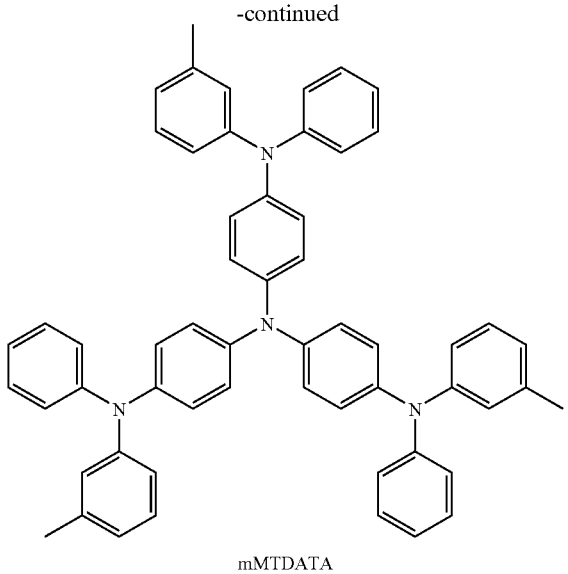

mMTDATA

[Measurement of Absorption Spectrum of Compound]

Figure 6A:
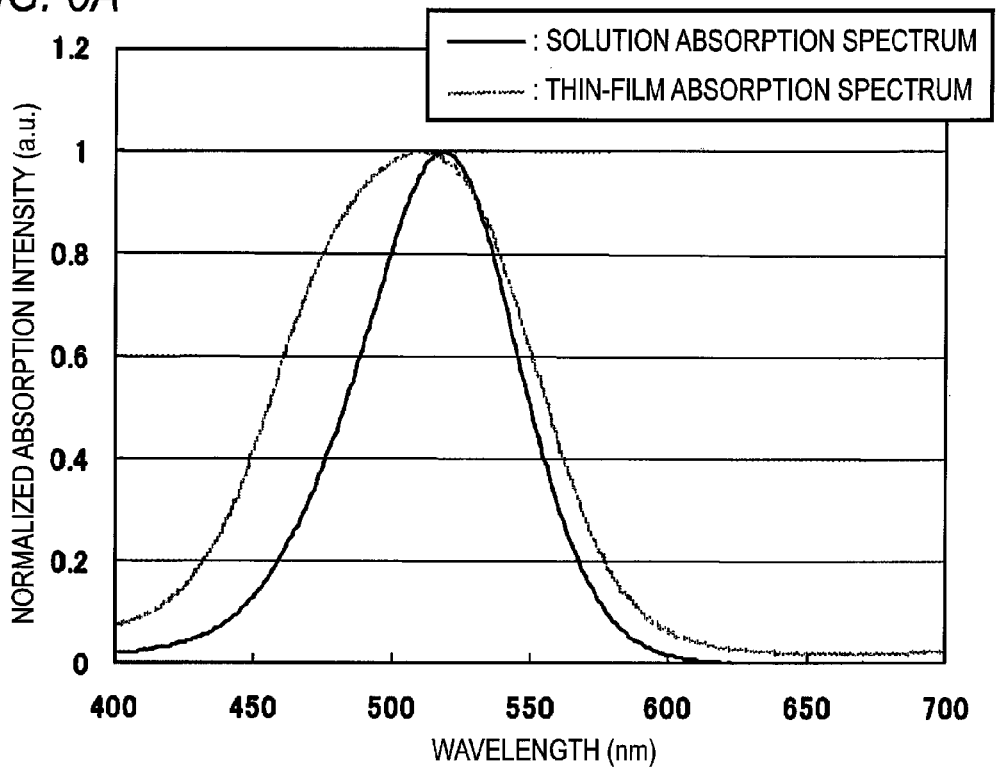
FIG. 6A is a graph showing the absorption spectrum for Compound (1)
Figure 6B:
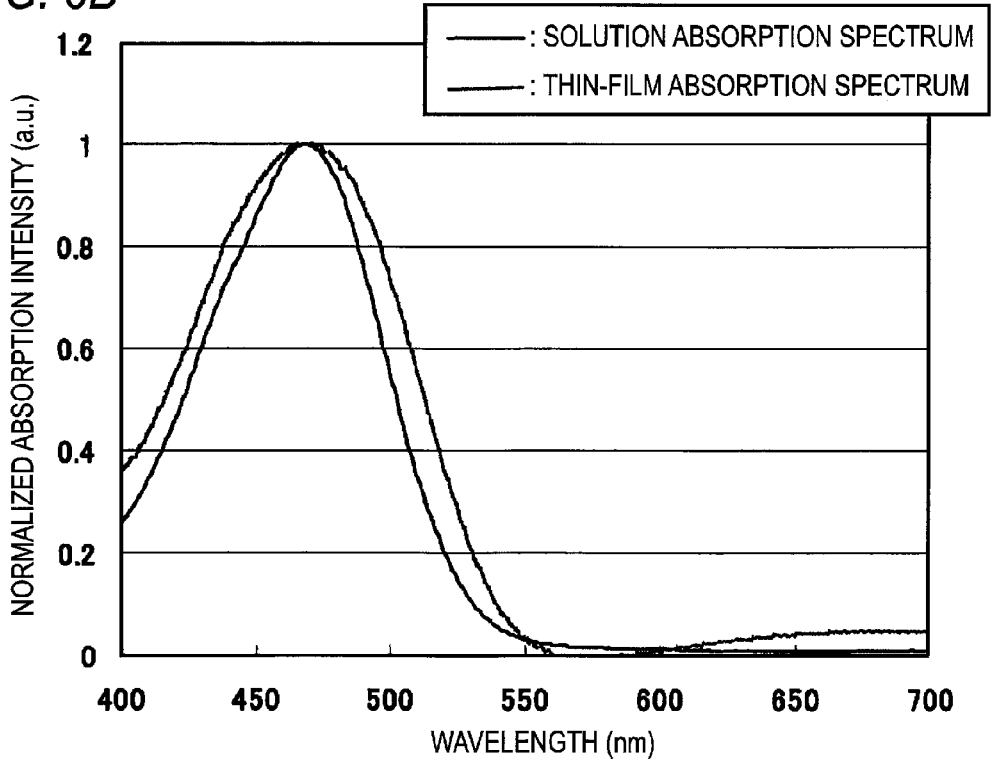
FIG. 6B is a graph showing the absorption spectrum for Comparative Compound.
Figure 7:
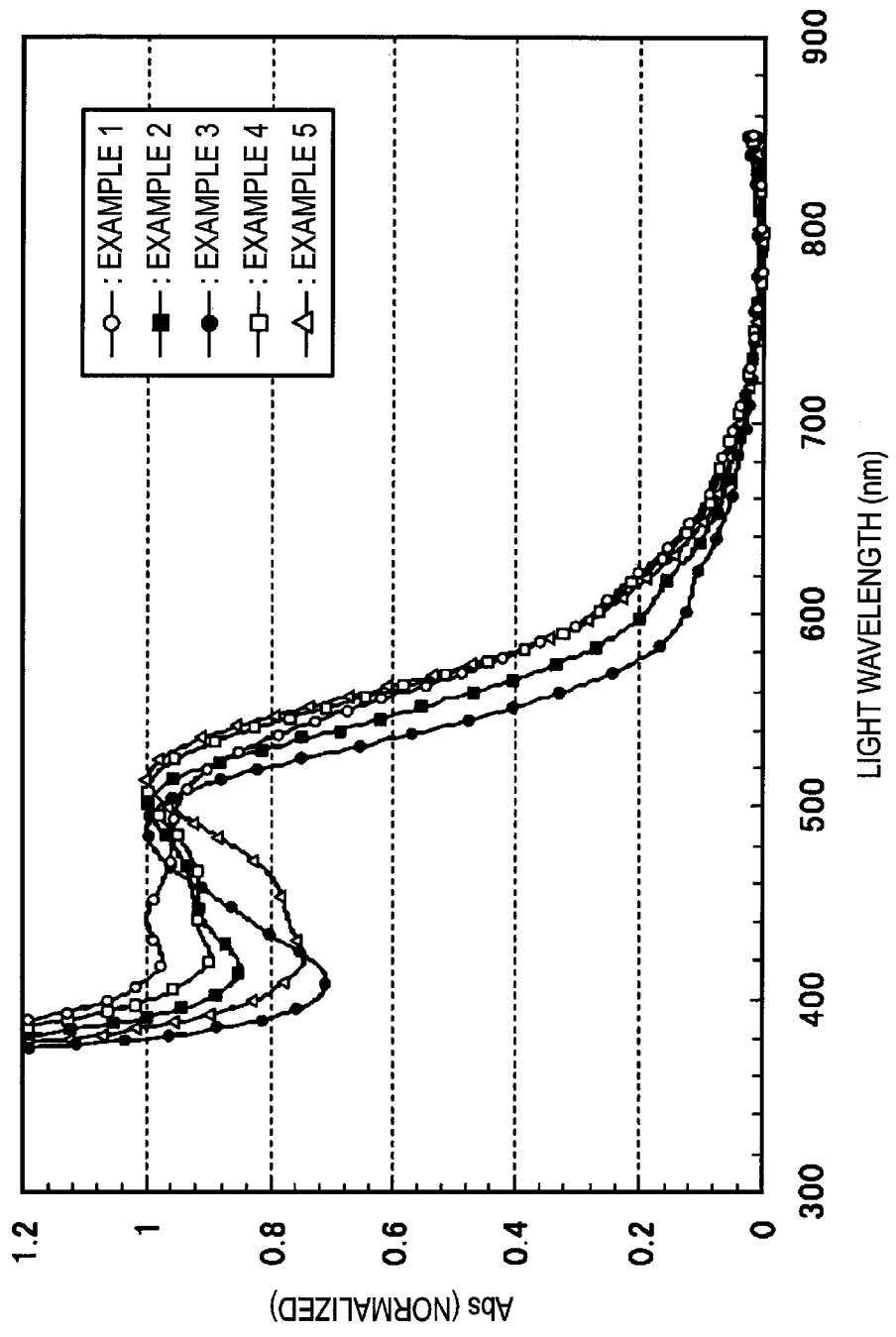
FIG. 7 is a graph showing thin-film absorption spectra for a co-deposited layer of Compound (1) and fullerene $C_{60}$ in Examples 1 to 5.
Figure 8:
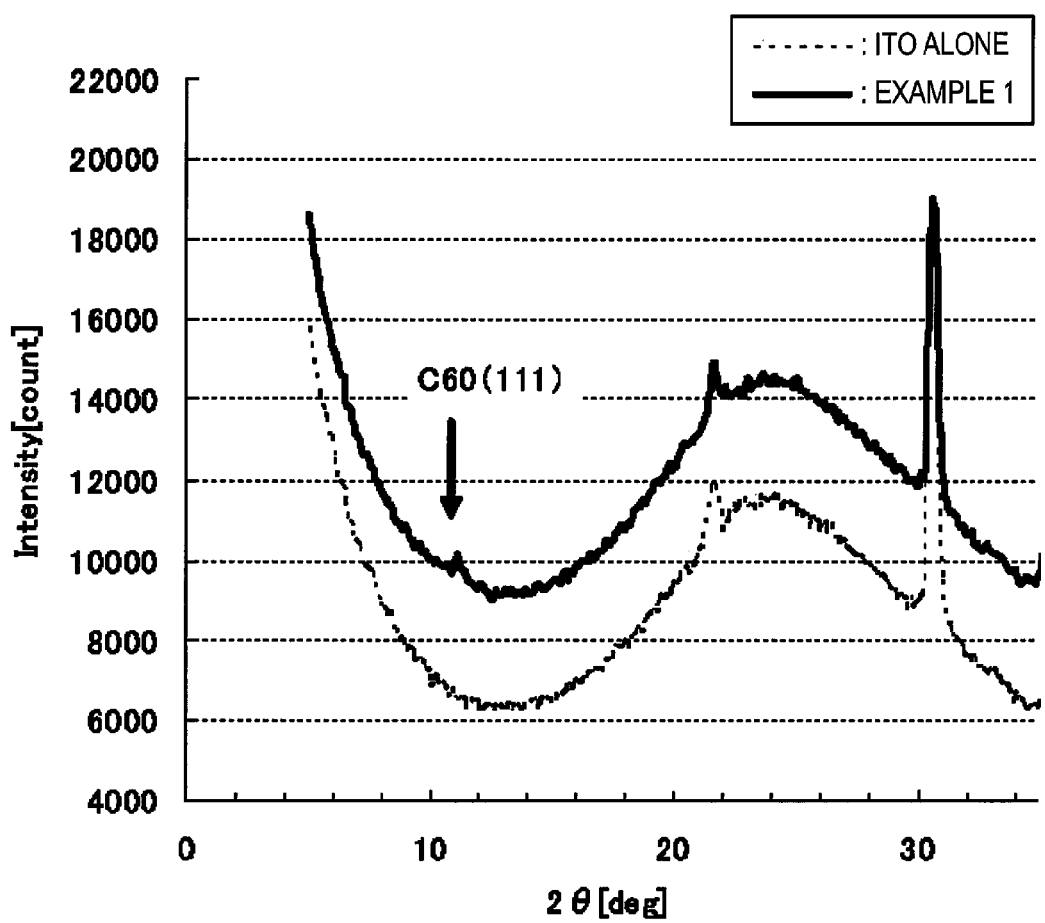
FIG. 8 is a graph showing an X-ray diffraction pattern for a co-deposited layer containing fullerene $C_{60}$ in Example 1.
Figure 9:
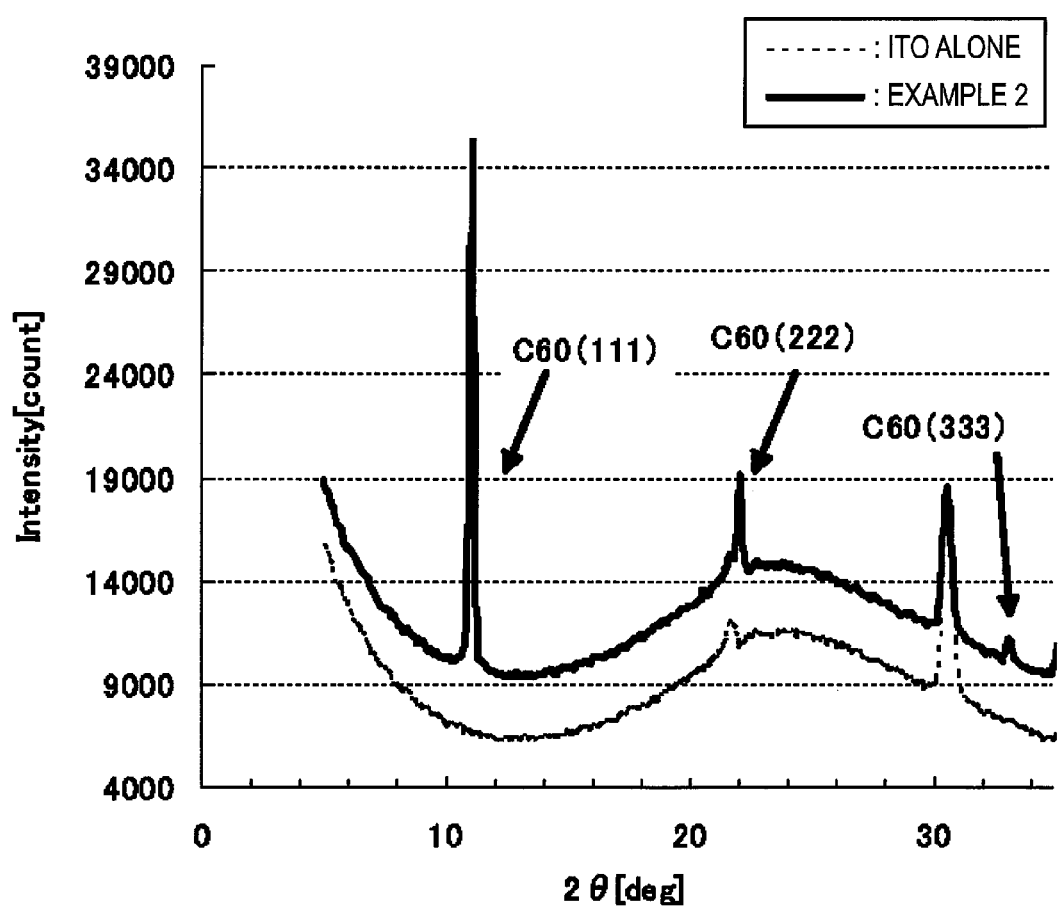
FIG. 9 is a graph showing an X-ray diffraction pattern for a co-deposited layer containing fullerene $C_{60}$ in Example 2.
Figure 10:
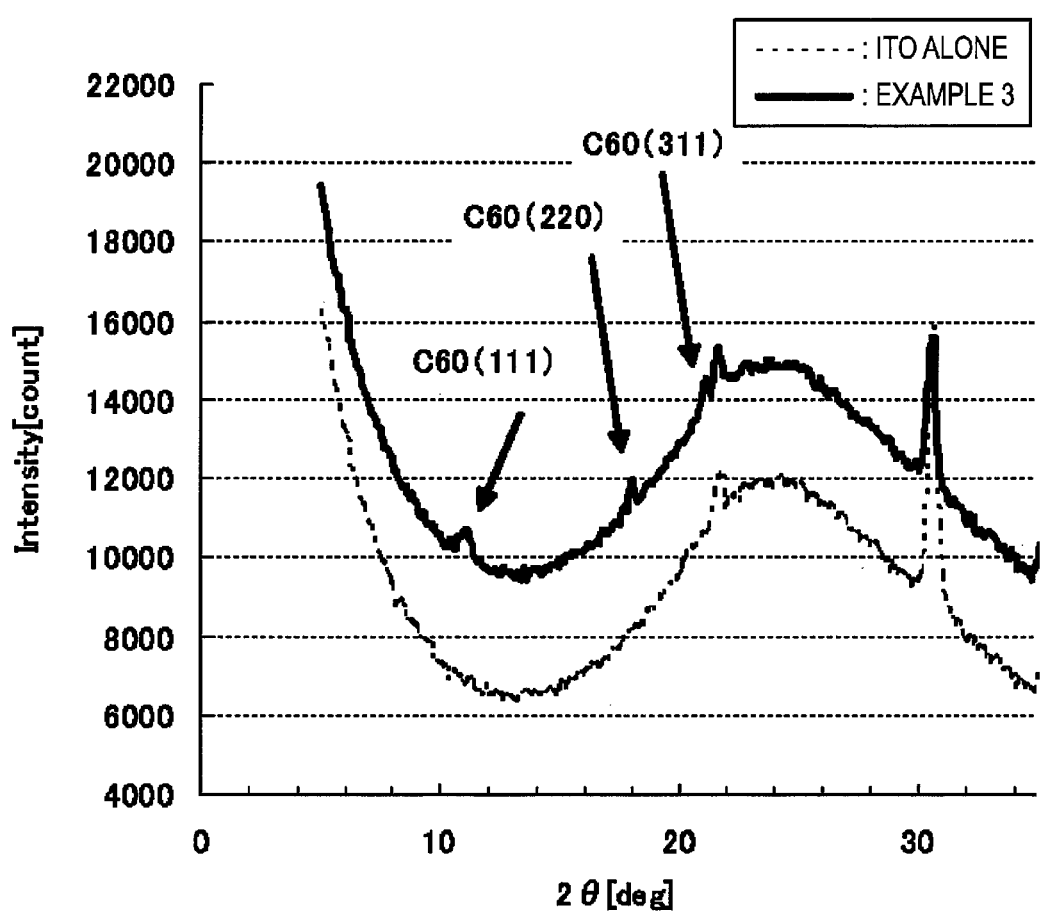
FIG. 10 is a graph showing an X-ray diffraction pattern for a co-deposited layer containing fullerene $C_{60}$ in Example 3.
Figure 11:
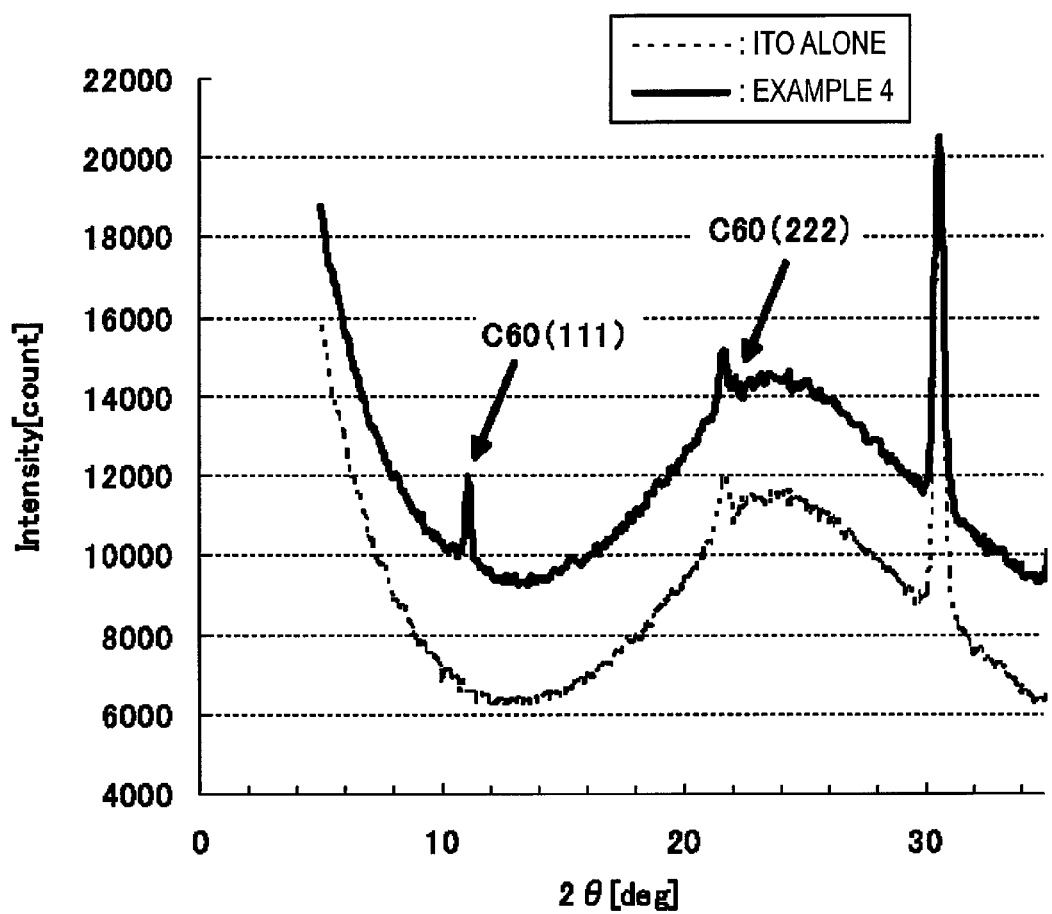
FIG. 11 is a graph showing an X-ray diffraction pattern for a co-deposited layer containing fullerene $C_{60}$ in Example 4.
Figure 12:
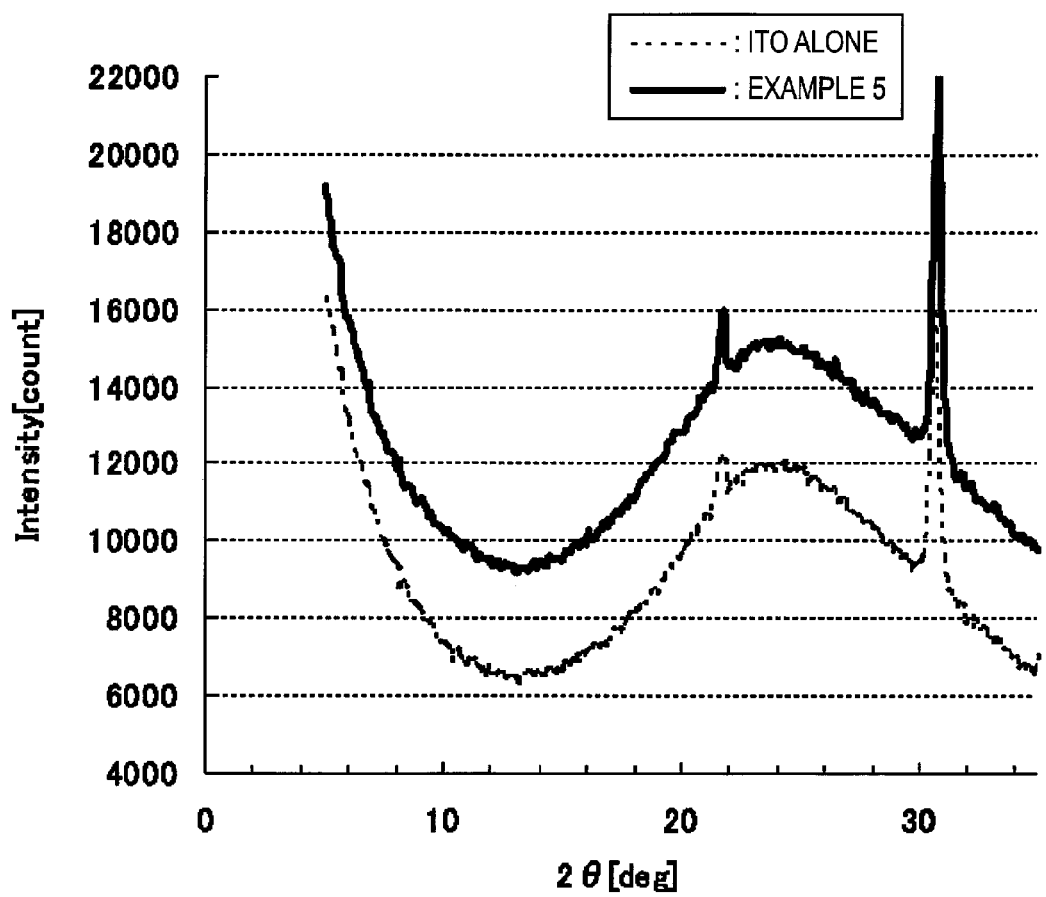
FIG. 12 is a graph showing an X-ray diffraction pattern for a co-deposited layer containing fullerene $C_{60}$ in Example 5.

With respect to Compound (1) and Comparative Compound, the chloroform solution absorption spectrum and the thin-film absorption spectrum of a single material film were measured for each compound according to the following method. FIGS. 6A and 6B show the absorption spectra obtained. FIG. 6A shows the absorption spectra of Compound (1) and FIG. 6B shows the absorption spectra of Comparative Compound. Also, FIG. 7 shows the thin-film absorption spectra of the co-deposited layer of Compound (1) and fullerene $C_{60}$ in Examples 1 to 5. Here, the absorption spectra shown in FIGS. 6A, 6B and 7 are an absorption spectrum normalized on the assumption that the maximum absorbance in a region of 400 to 800 nm is 1. Furthermore, $\lambda_{L1}$, $\lambda_{L2}$, $\lambda_{M1}$ and $\lambda_{M2}$ are shown in the Table below.

As seen from FIGS. 6A, 6B and 7 and the Table below, the thin-film absorption spectrum of Compound (1) is shifted to the short wavelength side with respect to the chloroform solution absorption spectrum, revealing that this is a compound showing what the present invention describes as "an H-aggregation propensity" in a thin-film state. On the other hand, the thin-film absorption spectrum of Comparative Compound is almost evenly spread to both the short wavelength side and the long wavelength side with respect to the chloroform solution absorption spectrum, revealing that what the present invention describes as "H-aggregation and J-aggregation are mixed at the same level" is caused in a thin-film state.

(Chloroform Solution Absorption Spectrum)

The compound was dissolved in chloroform in a concentration of 0.005 mM. By taking chloroform alone as a reference, the vertically transmitted light component at each wavelength was detected and thereby, the absorption spectrum was measured.

(Thin-Film Absorption Spectrum)

On a glass substrate having deposited thereon ITO to a thickness of 100 nm, each compound was deposited to a thickness of 100 nm By taking the glass substrate having deposited thereon 100 nm-thick ITO as a reference, the vertically transmitted light component at each wavelength was detected and thereby, the absorption spectrum was measured.

TABLE 1

| | $\lambda_{L1}$ (nm) | $\lambda_{L2}$ (nm) | $\lambda_{M1}$ (nm) | $\lambda_{M2}$ (nm) | $\Delta|\lambda_{M1} - \lambda_{L1}|$ (nm) | $\Delta|\lambda_{M2} - \lambda_{L2}|$ (nm) |
|---|---|---|---|---|---|---|
| Compound (1) | 483 | 551 | 455 | 556 | 28 | 5 |
| Comparative Compound | 423 | 503 | 416 | 513 | 7 | 10 |

[Analysis of X-Ray Diffraction]

Using an X-ray diffractometer (2θ-θ method), the X-ray diffraction when the co-deposited layer of Compound (1) and fullerene $C_{60}$ in Examples 1 to 5 was deposited on an ITO electrode substrate was analyzed (the sample was set so that θ=0° could correspond to the horizontal direction, that is, θ=90° could correspond to the direction perpendicular to the substrate). FIGS. 8 to 12 show the results.

[Evaluation]

With respect to the devices of Examples 1 to 5 and Comparative Example 1, the photoelectric conversion efficiency and the rising time from 0 to 98% signal strength were measured and evaluated. Here, the photoelectric conversion efficiency is a photoelectric conversion efficiency at a wavelength where the photoelectric conversion efficiency is highest in the range of from 400 to 800 nm (maximum sensitivity wavelength). Also, the rising time from 0 to 98% signal strength is a time until reaching a signal amount of 98% after entering of light on the assumption that the signal amount in an equilibrium state is 100%. Furthermore, as for the applied voltage, the same appropriate electric field intensity among respective Examples was applied for each item. In this connection, a positive voltage was applied to the pixel electrode side, and electrons were trapped on the pixel electrode side. The results obtained are shown in the Table below. In the Table below, "H-Aggregation Propensity of Photoelectric Conversion Material" and "Enhancement of H-Aggregation Propensity of Photoelectric Conversion Layer" indicate an absorption spectrum behavior described in the specification of the present invention.

TABLE 2

| | Photoelectric Conversion Efficiency (relative value) | Rising Time from 0 to 98% Signal Strength (relative value) | H-Aggregation Propensity of Photoelectric Conversion Material | Enhancement of H-Aggregation Propensity of Photoelectric Conversion Layer (judgment relative to that at room-temperature deposition (Example 1)) | $C_{60}$ Crystallinity (evaluation from X-ray diffraction pattern) |
|---|---|---|---|---|---|
| Example 1 | 1 | 1 | recognized | — | weak (only (111) peak was observed); whether (111) or other orientation could not be identified |

TABLE 2-continued

| | Photoelectric Conversion Efficiency (relative value) | Rising Time from 0 to 98% Signal Strength (relative value) | H-Aggregation Propensity of Photoelectric Conversion Material | Enhancement of H-Aggregation Propensity of Photoelectric Conversion Layer (judgment relative to that at room-temperature deposition (Example 1)) | $C_{60}$ Crystallinity (evaluation from X-ray diffraction pattern) |
|---|---|---|---|---|---|
| Example 2 | 1.9 | 1 | recognized | enhanced H-aggregation propensity | (111) orientation, crystallinity |
| Example 3 | 2.1 | 1 | recognized | enhanced H-aggregation propensity | no orientation, strongly crystallized |
| Example 4 | 1.4 | 1 | recognized | equal to Example 1 | (111) orientation, crystallinity |
| Comparative Example 1 | 0.3 | 10 | no specific aggregation propensity | — | — |
| Example 5 | 0.9 | 1 | recognized | equal to Example 1 or slightly weakened | crystallinity was not recognized |

Also, with respect to the devices of Examples 2 and 3, the dark current was measured. The applied voltage was the same as above. A source meter was connected to the device produced, and the amount of current flowed was measured while applying a voltage in a state of being kept from light, whereby the dark current was measured. The measurement results of dark current of Examples 2 and 3 are shown in the Table below.

TABLE 3

| | Dark Current (relative value) |
|---|---|
| Example 2 | 1 |
| Example 3 | 2.5 |

As seen from Table 2, the devices according to Examples are excellent in the photoelectric conversion efficiency and have a short response time. Thus, according to the present invention, a photoelectric conversion device with high sensitivity and high response speed can be obtained. Incidentally, it is seen that in Examples 2 and 3 where the H-aggregation propensity is further enhanced, the photoelectric conversion efficiency is more improved. Also, as seen from Table 3, a photoelectric conversion device more reduced in the dark current is obtained by controlling the orientation ((111) orientation) of fullerene $C_{60}$ in the photoelectric conversion film. Furthermore, when an imaging device is fabricated using the photoelectric conversion device of Examples 1 to 5, an imaging device with high sensitivity and high response speed is obtained.

The entire disclosure of Japanese Patent Application No. 2009-136722 filed on Jun. 5, 2009, Japanese Patent Application No. 2010-127490 filed on Jun. 3, 2010, from which the benefit of foreign priority has been claimed in the present application, is incorporated herein by reference, as if fully set forth.

What is claimed is:

1. A photoelectric conversion device comprising an electrically conductive film, a photoelectric conversion layer, and a transparent electrically conductive film, wherein
said photoelectric conversion layer contains a fullerene or a fullerene derivative and a photoelectric conversion material having an absorption spectrum satisfying at least either the following condition (A) or (B):

$$\lambda_{M1} < \lambda_{L1} \text{ and } \lambda_{M2} < \lambda_{L2} \quad (A)$$

$$\lambda_{M1} < \lambda_{L1} \text{ and } \Delta|\lambda_{M1} - \lambda_{L1}| > \Delta|\lambda_{M2} - \lambda_{L2}| \quad (B)$$

wherein $\lambda_{L1}$, $\lambda_{L2}$, $\lambda_{M1}$ and $\lambda_{M2}$ are the wavelength at an absorption intensity of ½ of the maximum absorption intensity in the wavelength range of from 400 to 800 nm, each of $\lambda_{L1}$ and $\lambda_{L2}$ represents the wavelength in a chloroform solution spectrum when said photoelectric conversion material is dissolved in chloroform, and each of $\lambda_{M1}$ and $\lambda_{M2}$ represents the wavelength in a thin-film absorption spectrum of said photoelectric conversion material alone, provided that $\lambda_{L1} < \lambda_{L2}$ and $\lambda_{M1} < \lambda_{M2}$, and
wherein the photoelectric conversion material is a triarylamine compound represented by:

Formula (I):

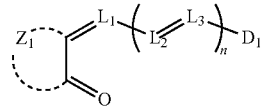

where $Z_1$ represents an atomic group necessary for forming a 5- or 6-membered ring, each of $L_1$ $L_2$ and $L_3$ represents an unsubstituted methine group or a substituted methine group, $D_1$ represents an atomic group, and n represents an integer of 0 or more.

2. The photoelectric conversion device as claimed in claim 1, wherein said condition (B) is the following condition (B'):

$$\lambda_{M1} < \lambda_{L1} \text{ and } \Delta|\lambda_{M1} - \lambda_{L1}| > 2 \times \Delta|\lambda_{M2} - \lambda_{L2}| \quad (B')$$

3. The photoelectric conversion device as claimed in claim 1, wherein said condition (B) is the following condition (B"):

$$\lambda_{M1} < \lambda_{L1} \text{ and } \Delta|\lambda_{M1} - \lambda_{L1}| > 3 \times \Delta|\lambda_{M2} - \lambda_{L2}| \quad (B'')$$

4. The photoelectric conversion device as claimed in claim 1, which contains a state where at least a part of said fullerene or fullerene derivative is crystallized.

5. The photoelectric conversion device as claimed in claim 4, wherein said fullerene or fullerene derivative is oriented in the (111) direction with respect to the substrate.

6. The photoelectric conversion device as claimed in claim 1, wherein said electrically conductive film, said photoelectric conversion layer and said transparent electrically conductive film are stacked in this order.

7. An imaging device equipped with the photoelectric conversion device claimed in claim 1, comprising:
- a semiconductor substrate having stacked thereabove said photoelectric conversion layer,
- a charge accumulation part for accumulating electric charges generated in said photoelectric conversion layer, which is formed inside of said semiconductor substrate, and
- a connection part for transmitting an electric charge of said photoelectric conversion layer to said charge accumulation part.

8. A production method of the photoelectric conversion device claimed in claim 1, comprising:
- a step of forming said electrically conductive film, said photoelectric conversion layer and said transparent electrically conductive film on a substrate, and
- a step of, in the formation of said photoelectric conversion layer, co-depositing a fullerene or a fullerene derivative and a photoelectric conversion material having an absorption spectrum satisfying at least either the condition (A) or (B), in a state of heating the substrate.

9. The production method as claimed in claim 8, wherein the vapor deposition rate at said co-deposition is from 0.5 to 3 Å/s.

10. The production method as claimed in claim 8, wherein the temperature of said substrate is 100° C. or less.

* * * * *